(12) United States Patent
Endo

(10) Patent No.: US 7,667,549 B2
(45) Date of Patent: Feb. 23, 2010

(54) SEMICONDUCTOR DEVICE AND DRIVING METHOD THEREOF

(75) Inventor: Masami Endo, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 12/076,988

(22) Filed: Mar. 26, 2008

(65) Prior Publication Data

US 2008/0266010 A1 Oct. 30, 2008

(30) Foreign Application Priority Data

Apr. 26, 2007 (JP) ............................. 2007-117425

(51) Int. Cl.
*H03B 5/24* (2006.01)
*H03K 3/03* (2006.01)
*H04B 1/38* (2006.01)
*H04B 1/40* (2006.01)

(52) U.S. Cl. ........................... 331/173; 331/57; 455/73; 455/90.1

(58) Field of Classification Search ................... 331/57, 331/74, 172–174; 327/291; 455/73, 90.1
See application file for complete search history.

(56) References Cited

U.S. PATENT DOCUMENTS

| | | | |
|---|---|---|---|
| 5,182,442 A | 1/1993 | Takahira | |
| 5,212,373 A | 5/1993 | Fujioka et al. | |
| 5,365,047 A | 11/1994 | Yamaguchi | |
| 5,424,690 A | 6/1995 | Ohno | |
| 5,661,751 A | 8/1997 | Johnson | |

(Continued)

FOREIGN PATENT DOCUMENTS

EP 0446519 A 9/1991

(Continued)

OTHER PUBLICATIONS

Wang et al., "An Ultra-Low-Power Fast-Lock-in Small-Jitter All-Digital DLL," ISSCC 2005, IEEE International Solid-State Circuits Conference, Feb. 9, 2005, pp. 422, 423 and 607.

(Continued)

*Primary Examiner*—David Mis
(74) *Attorney, Agent, or Firm*—Eric J. Robinson; Robinson Intellectual Property Law Office, P.C.

(57) ABSTRACT

A low-power-consumption semiconductor device and a driving method thereof where a clock signal generation is controlled. A transmission and reception control circuit to control signal communication with an outside; a ring oscillator control circuit to detect an edge in a receiving signal and control a ring oscillator; a clock generation circuit to generate a clock signal based on the ring oscillator; and a logic circuit to operate based on a clock signal are included. During signal communication between the transmission and reception control circuit and the outside, the ring oscillator operates and a clock signal is output from the clock generation circuit when the ring oscillator control circuit detects an edge in a receiving signal, and the ring oscillator stops and output of the clock signal from the clock generation circuit stops when transmission of a reply signal from the transmission and reception control circuit to the outside is terminated.

18 Claims, 17 Drawing Sheets

U.S. PATENT DOCUMENTS

| | | | |
|---|---|---|---|
| 5,761,255 A * | 6/1998 | Shi | 375/360 |
| 6,223,990 B1 | 5/2001 | Kamei | |
| 2008/0012616 A1 | 1/2008 | Endo et al. | |

FOREIGN PATENT DOCUMENTS

| | | |
|---|---|---|
| EP | 0569131 A | 11/1993 |
| EP | 0634837 A | 1/1995 |
| JP | 07-249743 | 9/1995 |
| JP | 11-215043 | 8/1999 |

OTHER PUBLICATIONS

'Search Report (Application No. 08005882.9) Dated Sep. 4, 2009.

* cited by examiner

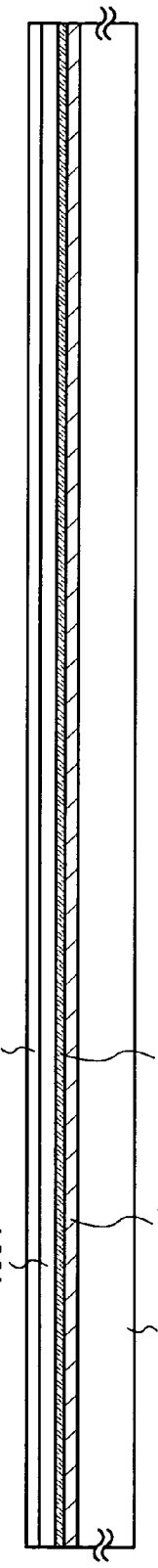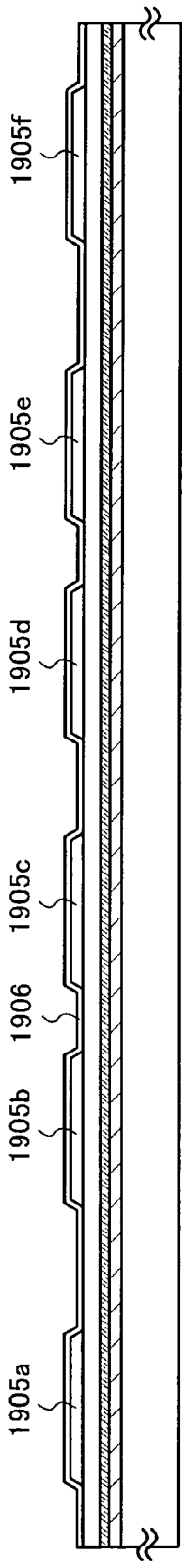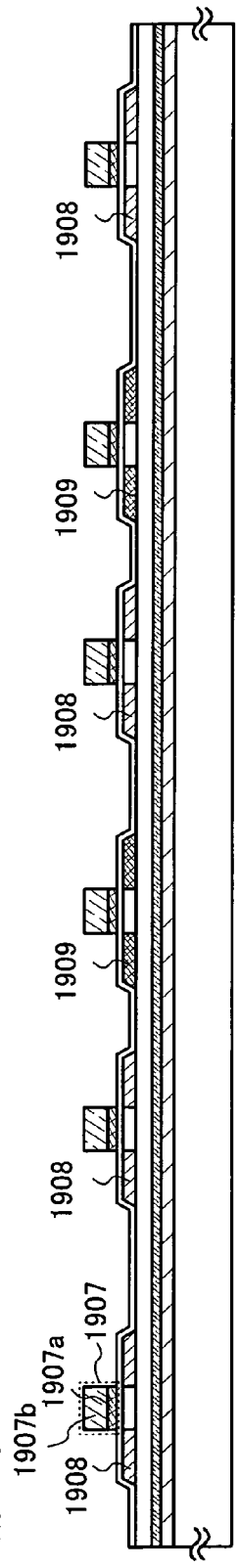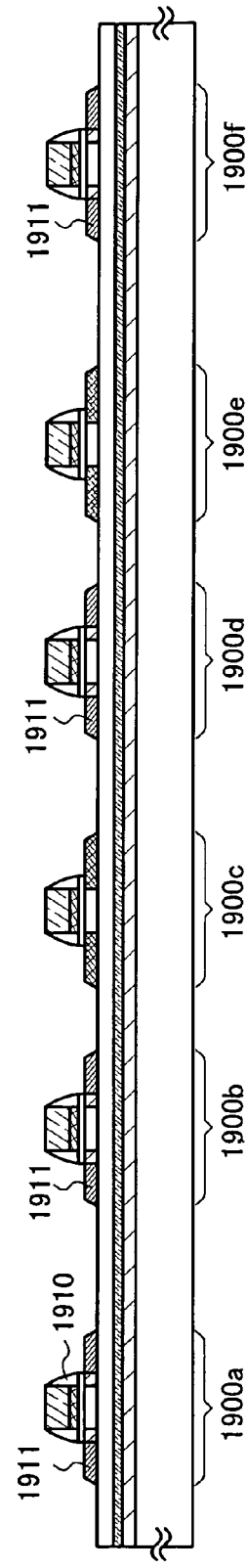

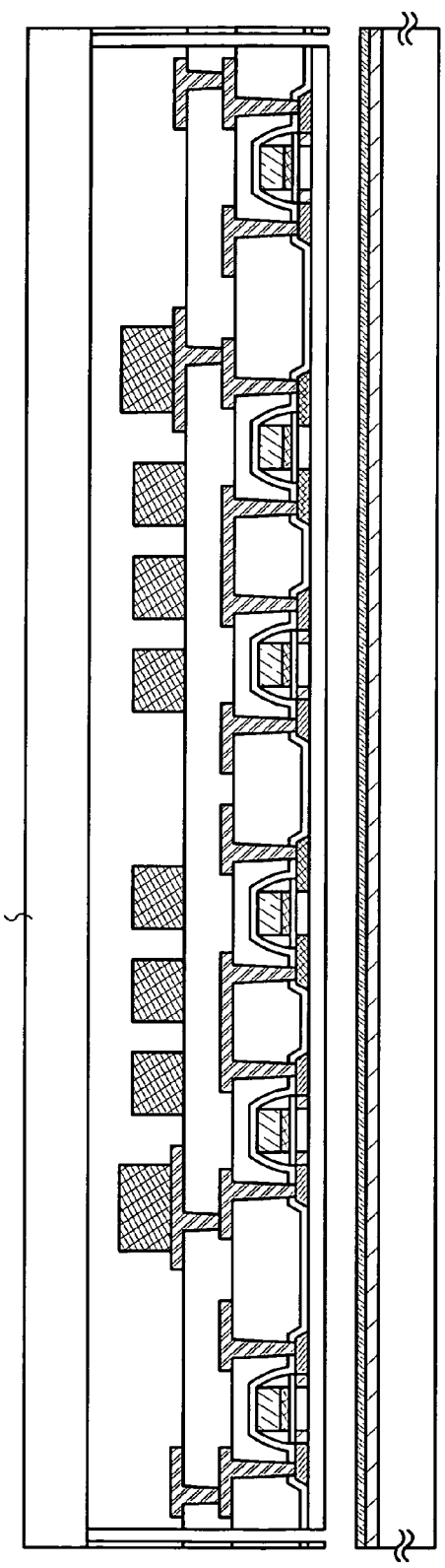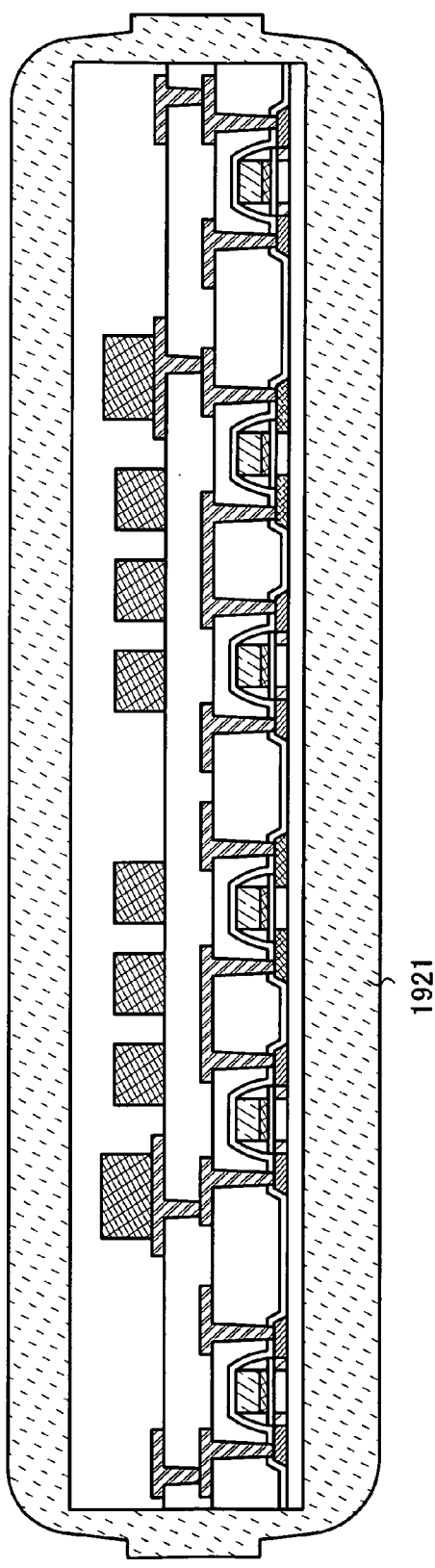
FIG. 11A  1920
FIG. 11B  1921

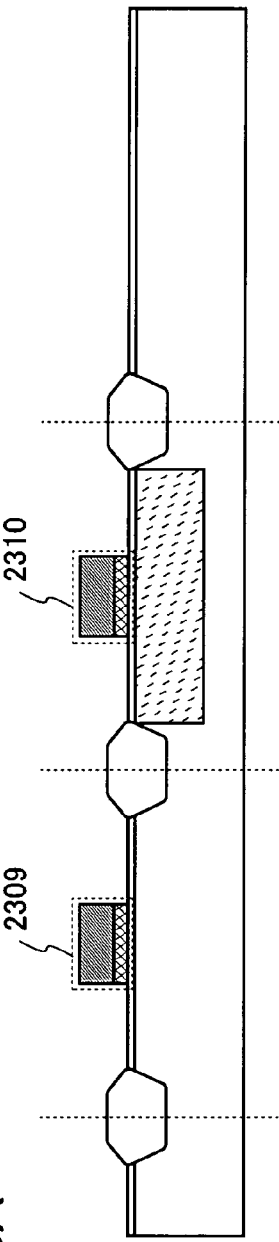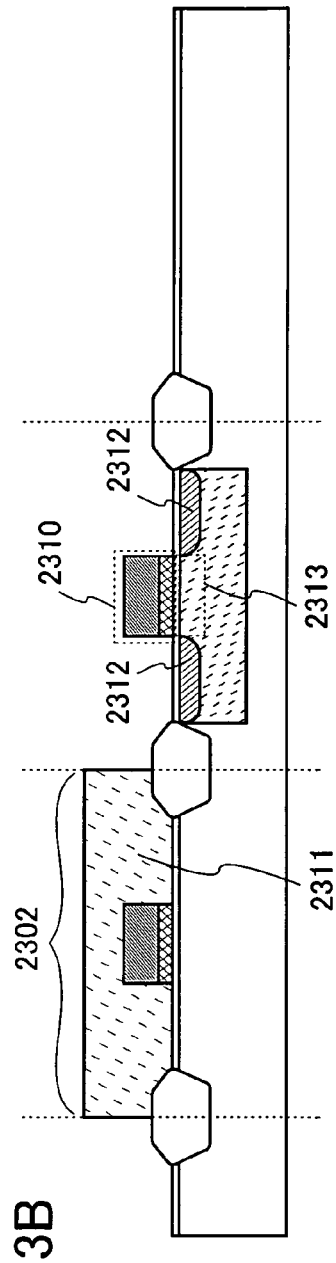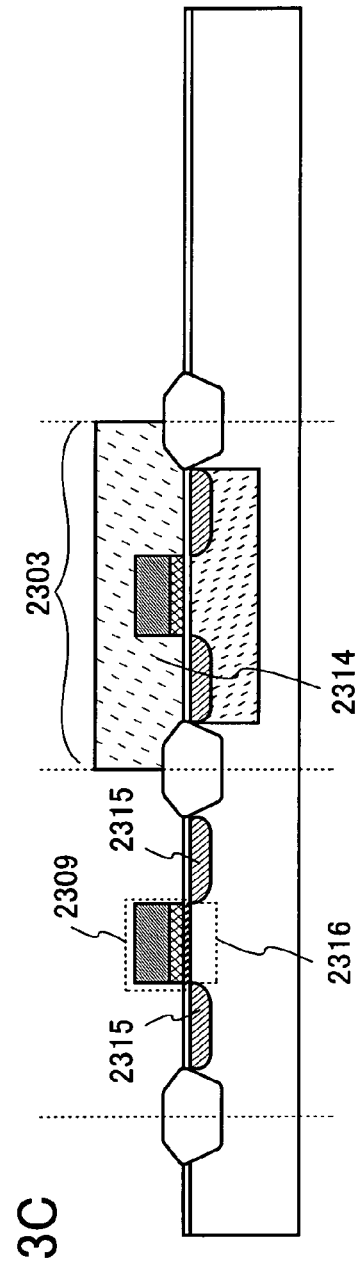
FIG. 13A
FIG. 13B
FIG. 13C

SEMICONDUCTOR DEVICE AND DRIVING METHOD THEREOF

BACKGROUND OF THE INVENTION

1. Field of the Invention

The present invention relates to a semiconductor device and a driving method thereof.

2. Description of the Related Art

In recent years, an individual identification technology using electromagnetic waves for wireless communication has attracted attention. In particular, as for a semiconductor device which communicates data by wireless communication, an individual identification technology using a semiconductor device utilizing RFID (radio frequency identification) which is also referred to as an RFID tag, an IC (integrated circuit) tag, an IC chip, an RF tag, a wireless tag, or an electronic tag has attracted attention. The individual identification technology using such a semiconductor device utilizing RFID has been used for production, management, or the like of an individual object, and application to personal authentication has been promoted.

Such a semiconductor device operates based on a signal which is received from an outside of the semiconductor device. Specifically, a signal output from a transmitting circuit of an external device is input to a receiving circuit provided for the semiconductor device such as an RFID tag.

In general, a signal that is transmitted from an external device to a semiconductor device includes a signal which is formed of only a carrier wave and a signal in which a carrier wave and a data signal are combined. When the semiconductor device receives a signal from an outside of the semiconductor device, a clock signal to operate the semiconductor device is generated.

However, in a period during which the semiconductor device communicates the signal (the signal which is formed of only a carrier wave or the signal in which a carrier wave and a data signal are combined) with the external device, a period during which a clock signal is needed for operation is a period from the start of analysis processing, arithmetic processing, or the like of a receiving signal with a logic circuit provided in the semiconductor device to transmission of a reply signal to the external device; that is, the period during which a clock signal is needed for operation is the case where the signal in which a carrier wave and a data signal are combined is received as a receiving signal.

Thus, in a conventional semiconductor device, even in a period during which a clock signal is not needed (a period during which the signal which is formed of only a carrier wave is received), a means for generating a clock signal, such as a ring oscillator is driven; consequently, large electric power is consumed for generation of the clock signal.

As a method for reducing the loss of power consumption, a communication terminal in which a clock signal which operates fast and a clock signal which operates slow are used and generation of the clock signal which operates fast is stopped in the case where there is no need of a clock signal has been proposed (e.g., Patent Document 1: Japanese Published Patent Application No. Hei11-215043).

SUMMARY OF THE INVENTION

However, in the communication terminal disclosed in Patent Document 1, since the clock signal which operates slow is generated regardless of whether or not the signal transmitted from an external device is received, unnecessary electric power is consumed. Further, it is difficult to be used for a passive-type tag for which a battery is not provided.

In view of the foregoing, it is an object of the present invention to reduce power consumption by controlling generation of a clock signal.

According to one feature of a semiconductor device of the present invention, a transmission and reception control circuit to control transmission and reception of a signal to and from an outside of the semiconductor device; a ring oscillator control circuit to detect an edge included in a receiving signal and control an operation of a ring oscillator; a clock generation circuit to generate a clock signal based on an operation of the ring oscillator; and a logic circuit to perform an operation when a clock signal is supplied are included, and, in a period during which the transmission and reception control circuit communicates a signal with the outside, the operation of the ring oscillator is started and a clock signal is output from the clock generation circuit when the ring oscillator control circuit detects an edge included in a receiving signal, and the operation of the ring oscillator is stopped and the output of the clock signal from the clock generation circuit is stopped when transmission of a reply signal from the transmission and reception control circuit to the outside is terminated.

Further, according to one feature of the semiconductor device of the present invention, in the above-described structure, the ring oscillator control circuit includes an edge detection circuit to detect an edge included in a receiving signal, a decision circuit to decide a state of the logic circuit, and an operation control circuit to control the operation of the ring oscillator, and the operation control circuit determines whether or not the ring oscillator operates based on the operation of the edge detection circuit and the decision circuit.

Further, according to one feature of the semiconductor device of the present invention, in the above-described structure, the ring oscillator control circuit includes an edge detection circuit to detect an edge, an edge counter circuit to count the number of edges, a receiving signal decision circuit to decide whether or not reception of a data signal starts based on signals output from the edge detection circuit and the edge counter circuit, a decision circuit to decide a state of the logic circuit, and an operation control circuit to control the operation of the ring oscillator, and the operation control circuit determines whether or not the ring oscillator operates based on the operation of the receiving signal decision circuit and the decision circuit.

Further, according to one feature of the semiconductor device of the present invention, in the above-described structure, in a period during which the transmission and reception control circuit communicates a signal with the outside, output of a clock signal is kept stopping until an edge is detected.

Further, according to one feature of an driving method of a semiconductor device of the present invention, a transmission and reception control circuit to control transmission and reception of a signal to and from an outside of the semiconductor device; a ring oscillator control circuit to detect an edge included in a receiving signal and control an operation of a ring oscillator; a clock generation circuit to generate a clock signal based on an operation of the ring oscillator; and a logic circuit to perform an operation when a clock signal is supplied are included, and, in a period during which the transmission and reception control circuit communicates a signal with the outside, the transmission and reception control circuit receives a receiving signal from the outside of the semiconductor device, the receiving signal is converted to a digital signal and output to the ring oscillator control circuit, the ring oscillator control circuit detects an edge included in the receiving signal which has been converted to the digital signal, and after the edge is detected, the operation of the ring oscillator is started, so that a clock signal is output from the clock generation circuit, and after the clock signal is output, the operation of the logic circuit is started, and a reply signal output from the logic circuit is transmitted through the transmission and reception control circuit to the outside, and after the transmission of the reply signal is terminated, the operation of the ring oscillator is stopped, and the output of the clock signal from the clock generation circuit is stopped.

Further, according to one feature of the driving method of the semiconductor device of the present invention, in the above-described structure, output of a clock signal is kept stopping until an edge is detected.

By use of the present invention, generation of a clock signal is controlled, so that power consumption can be reduced.

BRIEF DESCRIPTION OF THE DRAWINGS

FIGS. 9A to 9D are diagrams showing an example of a manufacturing method of a semiconductor device of the present invention.

FIGS. 11A and 11B are diagrams showing an example of a manufacturing method of a semiconductor device of the present invention.

FIGS. 13A to 13C are diagrams showing an example of a manufacturing method of a semiconductor device of the present invention.

DETAILED DESCRIPTION OF THE INVENTION

Figure 1:
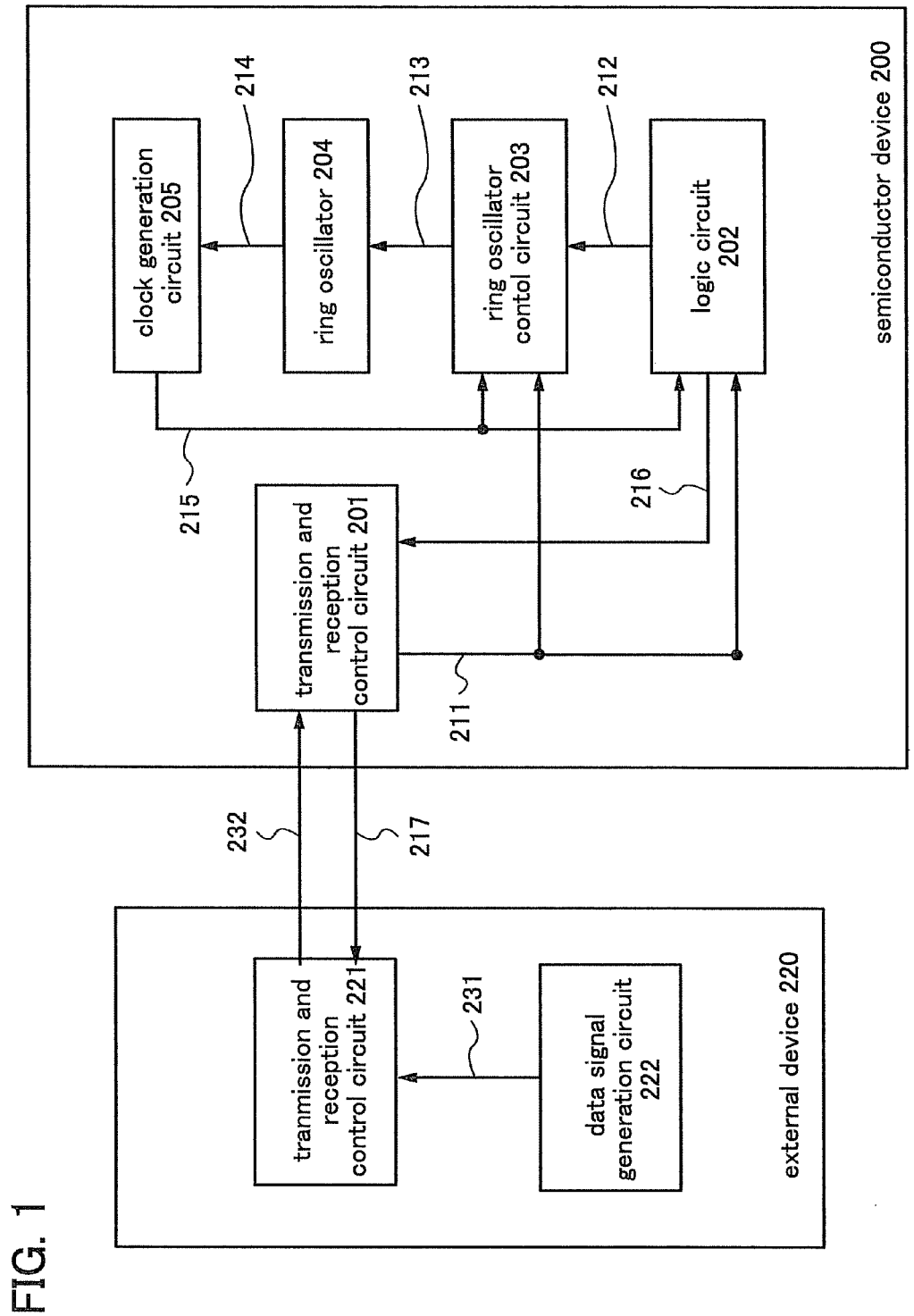
FIG. 1 is a diagram showing an example of a semiconductor device of the present invention.

Although the present invention will be fully described by way of embodiment modes with reference to the accompanying drawings, it is to be understood that various changes and modifications will be apparent to those skilled in the art. Therefore, unless such changes and modifications depart from the scope of the present invention, they should be construed as being included therein. Note that the same reference numerals are used to denote the same portions or portions having similar functions throughout the drawings in this specification, and the description thereof may be omitted.

Embodiment Mode 1

In this embodiment mode, an example of a structure of the semiconductor device of the present invention is described using drawings.

A semiconductor device described in this embodiment mode has the following structure; in a period during which communication of a signal is performed, a clock signal is generated in a period during which a clock signal is needed for operation of the semiconductor device, and generation of a clock signal is stopped in the case where a clock signal is not needed for the operation. The structure is described in detail below.

First, a structure of the semiconductor device of this embodiment mode is described using FIG. 1. Note that FIG. 1 shows the case where a semiconductor device 200 communicates a signal with an external device 220.

Further, in this embodiment mode, the case where the external device 220 including a transmission and reception control circuit 221 and a data signal generation circuit 222 communicates a signal (a signal 217 and a signal 232) with the semiconductor device 200 through the transmission and reception control circuit 221 is described. The signal 232 which is transmitted to the semiconductor device 200 from the external device 220 is generated by synthesizing a data signal 231 which is output from the data signal generation circuit 222 with a carrier wave in the transmission and reception control circuit 221. That is, the signal 232 includes a signal formed only of a carrier wave and a signal in which a carrier wave and the data signal 231 are combined.

Any device can be used as the external device 220 as long as it communicates data with the semiconductor device 200. For example, a reader for reading data, a reader/writer provided with a reading function and a writing function, and the like are given. Further, a mobile phone, a computer, and the like provided with at least one of a reading function and a writing function are included in its category.

In this specification, the 'period during which the semiconductor device 200 communicates a signal with the outside (the external device 220, here)' refers to a period during which the semiconductor device 200 receives the signal 232 from the external device 220. Thus, this period includes not only a period during which the semiconductor device 200 receives the signal in which a carrier wave and the data signal 231 are combined from the external device 220, but also a period during which the signal formed only of a carrier wave is received.

The semiconductor device shown in FIG. 1 includes at least a transmission and reception control circuit 201, a logic circuit 202, a ring oscillator control circuit 203, a ring oscillator 204, and a clock generation circuit 205.

The transmission and reception control circuit 201 has a function of receiving the signal 232 output from the external device 220 and a function of transmitting the signal 217 from the semiconductor device 200 to the external device 220. After receiving the signal 232 output from the external device 220, the transmission and reception control circuit 201 converts the signal 232 and outputs a signal 211 to the ring oscillator control circuit 203 and the logic circuit 202.

The logic circuit 202 is a circuit to perform analysis processing, arithmetic processing, or the like of the signal received from the external device 220. The analysis processing, arithmetic processing, or the like of the received signal is performed based on the signal 211 supplied from the transmission and reception control circuit 201 and a clock signal 215 supplied from the clock generation circuit 205. Then, after the analysis processing, arithmetic processing, or the like in the logic circuit 202, a reply signal 216 which is to be transmitted to the external device 220 is output to the transmission and reception control circuit 201, and the signal 217 is output to the external device 220 through the transmission and reception control circuit 201.

The ring oscillator control circuit 203 is a circuit to control the presence or absence of operation of the ring oscillator 204. In accordance with the signal 211 supplied from the transmission and reception control circuit 201 or a signal 212 supplied from the logic circuit 202, a control signal 213 to control the presence or absence of operation of the ring oscillator 204 is output.

For example, when an edge (the data signal 231 included in a carrier wave) is detected from the signal 211 which is output from the transmission and reception control circuit 201, a control signal 213 for operating the ring oscillator 204 is output from the ring oscillator control circuit 203 and the ring oscillator 204 starts operating.

On the other hand, the reply signal 216 is output from the logic circuit 202 to the transmission and reception control circuit 201, and when the period during which the signal 217 is transmitted to the external device 220 from the semiconductor device 200 based on the reply signal 216 is terminated, the operation of the ring oscillator 204 is stopped. In this case, when the period during which the signal 217 is transmitted from the semiconductor device 200 is terminated, the ring oscillator 204 is stopped based on the control signal 213 which is output from the ring oscillator control circuit 203 in accordance with the signal 212 which is output from the logic circuit 202.

The ring oscillator 204 is a circuit having a function of oscillating a signal and can be formed by connecting an odd number of inverters in series. In this embodiment mode, the presence or absence of the ring oscillator 204 is controlled in accordance with the control signal 213 which is output from the ring oscillator control circuit 203. When the ring oscillator 204 operates, an oscillation signal 214 is output to the clock generation circuit 205. Note that, in the semiconductor device described in this embodiment mode, such a circuit having a function of oscillating a signal is not limited to the ring oscillator. Instead of the ring oscillator, a crystal oscillator, a multi-vibrator, or the like may be provided as well.

The clock generation circuit 205 is a circuit to generate a clock signal, and generates the clock signal 215 based on the control signal 213 supplied from the ring oscillator 204. The clock signal 215 generated in the clock generation circuit 205 is supplied to the logic circuit 202 and the ring oscillator control circuit 203. Analysis processing, arithmetic processing, or the like of a data signal is performed in the logic circuit 202 based on the clock signal 215.

Figure 2:
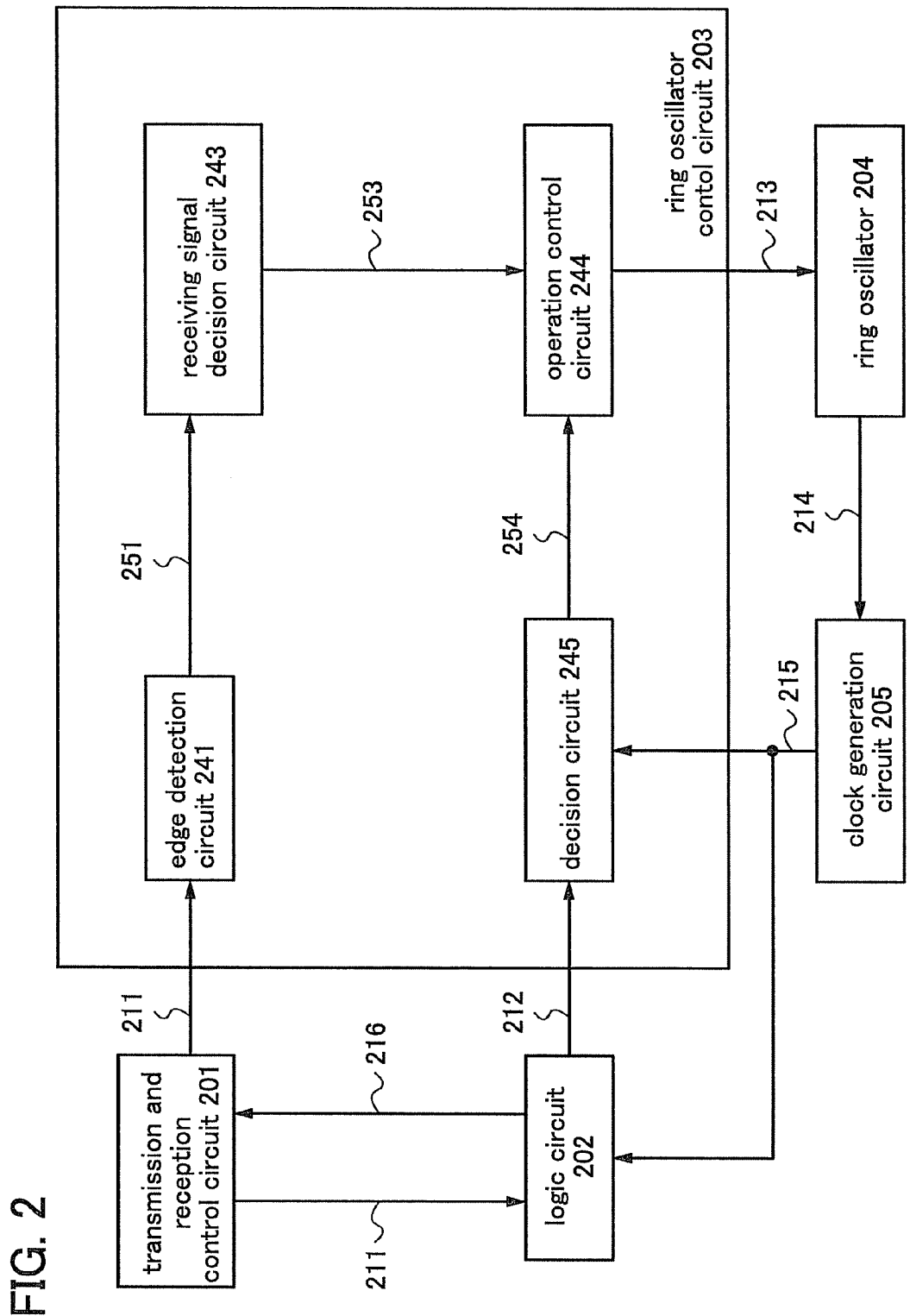
FIG. 2 is a diagram showing an example of a semiconductor device of the present invention.

Next, a specific structure of the ring oscillator control circuit 203 is described using FIG. 2.

The ring oscillator control circuit 203 includes an edge detection circuit 241, a receiving signal decision circuit 243, an operation control circuit 244, and a decision circuit 245.

The edge detection circuit 241 is a circuit to detect an edge (a data signal included in a carrier wave) included in the signal 211 which is output from the transmission and reception control circuit 201. When the edge is detected in the edge detection circuit 241, the detection of the edge in a receiving signal is transmitted to the receiving signal decision circuit 243 by a signal 251 which is output from the edge detection circuit 241.

When the edge is detected in the edge detection circuit 241, the receiving signal decision circuit 243 decides that reception of a data signal is started, based on the signal 251 which is output from the edge detection circuit 241. Then, by a signal 253 which is output from the receiving signal decision circuit 243, the start of reception of the data signal is transmitted to the operation control circuit 244. Note that, in the structure shown in FIG. 2, a structure in which the receiving signal decision circuit 243 is not provided and the signal 251 which is output from the edge detection circuit 241 is directly input to the operation control circuit 244 may be employed as well.

The operation control circuit 244 controls the presence or absence of the ring oscillator 204, using the control signal 213 which is output from the operation control circuit 244 in accordance with the signal 253 which is output from the receiving signal decision circuit 243 or a signal 254 which is output from the decision circuit 245. Specifically, when the sign of start of reception of the data signal is given by the signal 253 which is output from the receiving signal decision circuit 243, the control signal 213 for starting the operation of the ring oscillator 204 is output from the operation control circuit 244.

The decision circuit 245 decides the state of the logic circuit 202 in accordance with the clock signal 215 which is output from the clock generation circuit 205 and the signal 212 which is output from the logic circuit 202. After analysis processing and arithmetic processing of the received signal is performed by the logic circuit 202, the reply signal 216 is output to the transmission and reception control circuit 201, and when the transmission of the signal 217 from the semiconductor device 200 to the external device 220 is terminated, the control signal 213 for stopping operation of the ring oscillator 204 is output from the operation control circuit 244 based on the signal 254 which is output from the decision circuit 245.

In the semiconductor device 200 described in this embodiment mode, generation of the clock signal 215 in the semiconductor device 200 is performed not during the whole period in which the signal 232 is received from the external device 220, but only during the period which the clock signal 215 is needed for operation (the period from start of operation of the logic circuit 202 at the time of reception of the signal 232 to transmission of the signal 217 from the semiconductor device 200). That is, during the period from start of reception of the signal 232 in the semiconductor device 200 to start of operation of the logic circuit 202, in the period after termination of transmission of the signal 217 from the semiconductor device 200, or the like, output of the clock signal 215 is stopped in the semiconductor device 200. Thus, the following structure can be realized; the ring oscillator 204 is stopped and output of the clock signal 215 is stopped during the period in which a clock signal 215 is not needed for the operation of the semiconductor device 200.

Figure 3:
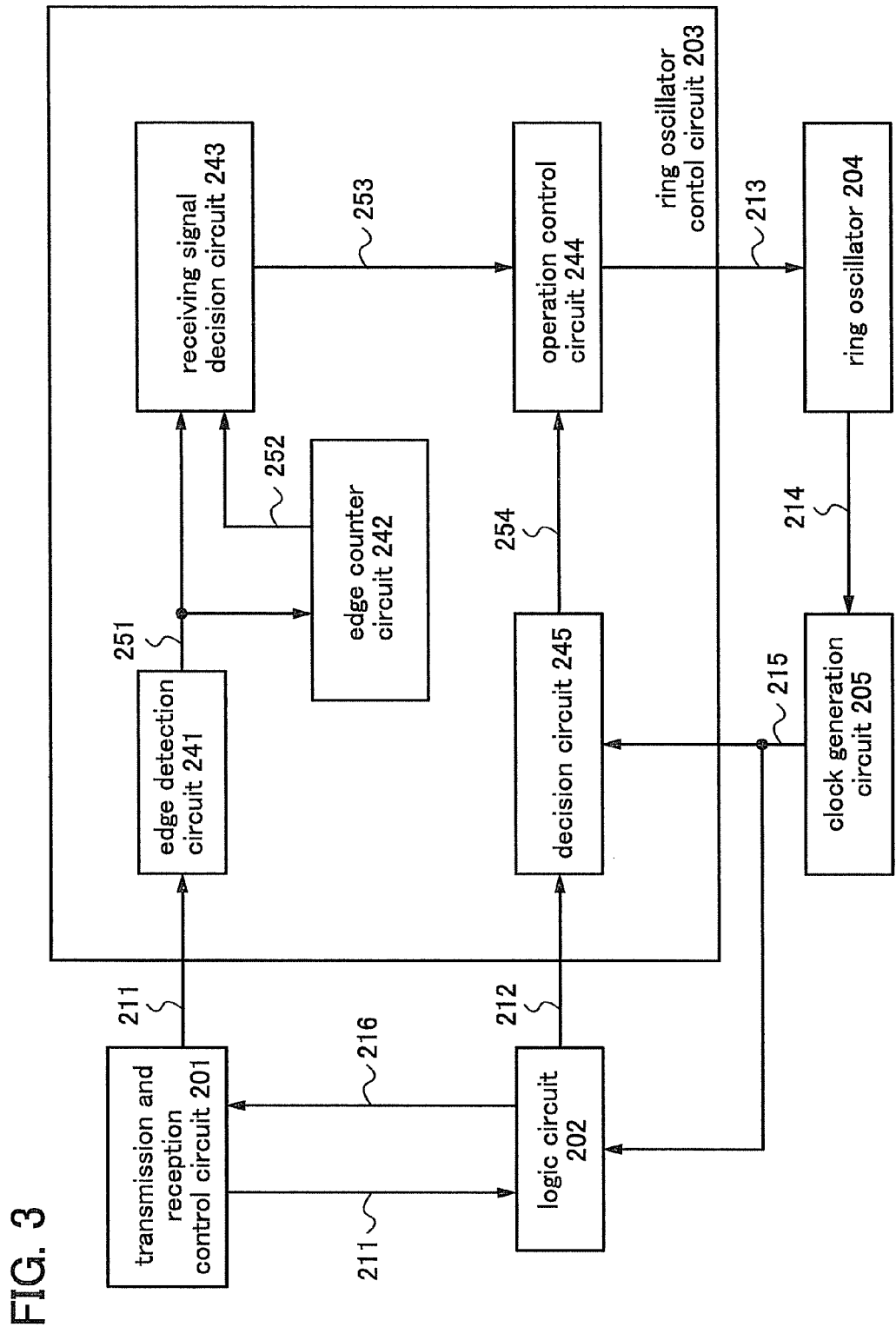
FIG. 3 is a diagram showing an example of a semiconductor device of the present invention.

Note that the semiconductor device described in this embodiment mode may also have a structure in which an edge counter circuit 242 is provided in addition to the structure shown in FIG. 2 (FIG. 3).

In the case where the edge counter circuit 242 is provided, the signal 251 which is output from the edge detection circuit 241 is input to the edge counter circuit 242 so that the number of edges is counted. Then, a signal 252 which is output from the edge counter circuit 242 and the signal 251 which is output from the edge detection circuit 241 are put together to be a decision signal of the receiving signal decision circuit 243. That is, the receiving signal decision circuit 243 decides whether or not reception of a data signal is started, based on the signal 251 which is output from the edge detection circuit 241 and the signal 252 which is output from the edge counter circuit 242.

By provision of the edge counter circuit 242, an operation (oscillation) point (timing) of the ring oscillator 204 can be controlled.

As described above, generation of the clock signal 215 is performed not during the whole period in which the semiconductor device 200 receives the signal 232 from the external device 220, but only during the period which a clock signal 215 is needed for the operation of the semiconductor device 200, by operating the ring oscillator 204; accordingly, power consumption can be reduced.

Note that this embodiment mode can be combined with any structure of a semiconductor device described in another embodiment mode in this specification, as appropriate.

Embodiment Mode 2

In this embodiment mode, an operation of the semiconductor device described in the above embodiment mode is described using drawings.

Figure 4:
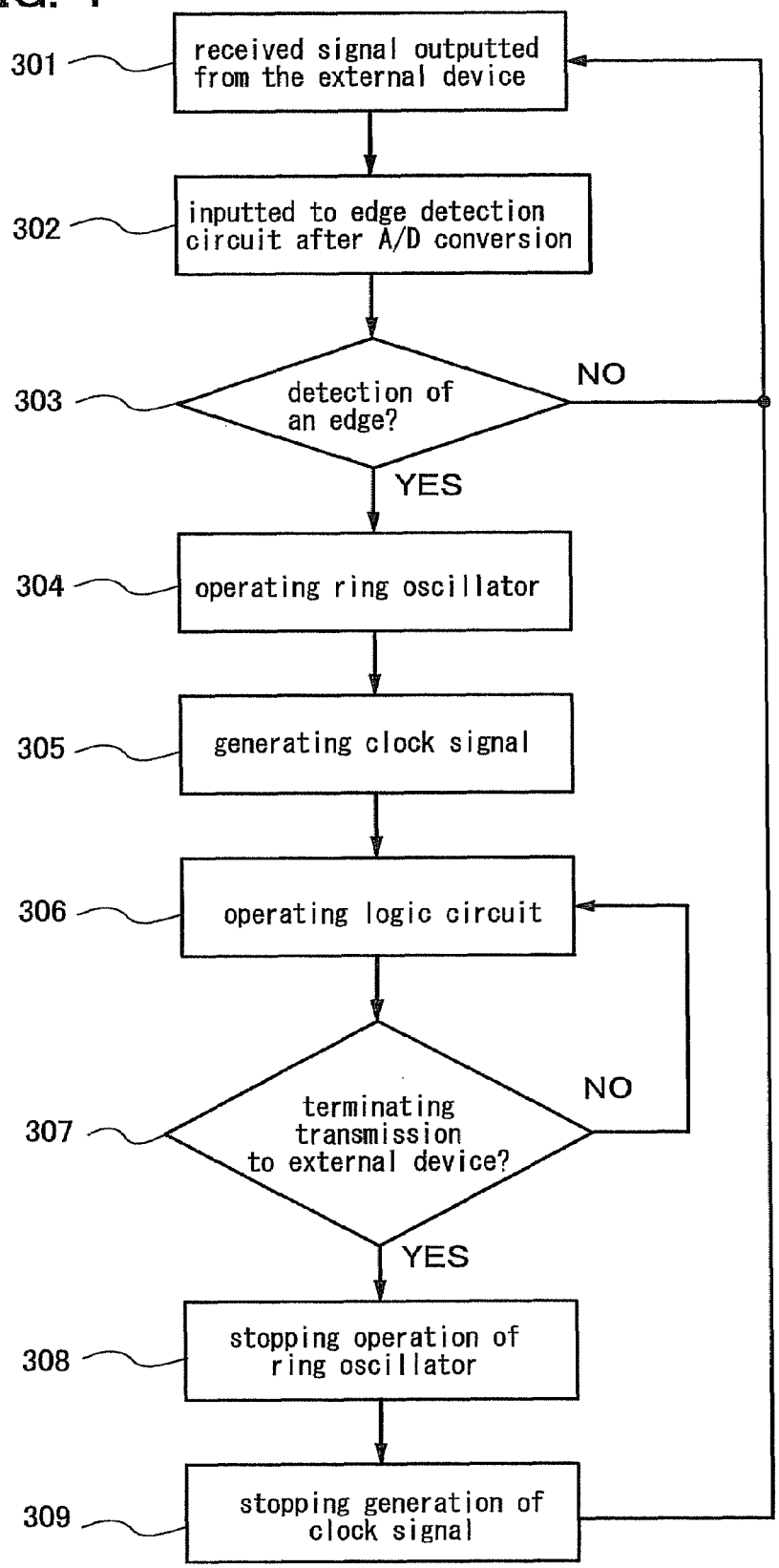
FIG. 4 is a chart describing an operation method of a semiconductor device of the present invention.

First, an operation of the semiconductor device 200 from reception of the signal 232 in the semiconductor device 200 transmitted from the external device 220 to transmission of the signal 217 which replies to the external device 220 is described using a flow chart in FIG. 4.

First, the signal 232 which is output from the external device 220 is received with the transmission and reception control circuit 201 in the semiconductor device 200 (301). Note that the signal 232 includes a signal formed only of a carrier wave and a signal in which a carrier wave and a data signal are combined.

Next, the signal 232 received is converted from analog to digital (A/D conversion) in the transmission and reception control circuit 201, and the converted signal 211 is input to the edge detection circuit 241 in the ring oscillator control circuit 203 (302). Detection of an edge is performed in the edge detection circuit 241 (303). Note that the 'edge is detected' means that the signal in which a carrier wave and a data signal are combined is detected from the signal 232 received. When the edge is detected (YES), the ring oscillator 204 is operated based on the control signal 213 which is output from the operation control circuit 244 (304).

Next, based on the signal 214 which is output from the ring oscillator 204, the clock signal 215 is generated in the clock generation circuit 205 and output to the logic circuit 202 and the ring oscillator control circuit 203 (305).

After analysis processing, arithmetic processing, or the like of the received signal based on the clock signal 215, the logic circuit 202 outputs the reply signal 216 to the transmission and reception control circuit 306.

Next, the decision circuit 245 decides whether or not transmission of the signal 217 from the transmission and reception control circuit 201 in the semiconductor device 200 to the external device 220 is terminated (307). When the transmission of the signal 217 terminates (YES), the operation of the ring oscillator 204 is stopped based on the control signal 213 which is output from the operation control circuit 244 (308). After that, since the operation of the ring oscillator 204 is stopped, the generation of the clock signal 215 in the clock generation circuit 205 is stopped (309).

The semiconductor device 200 operates by repeating the above-described operation from 301 to 309.

Figure 5:
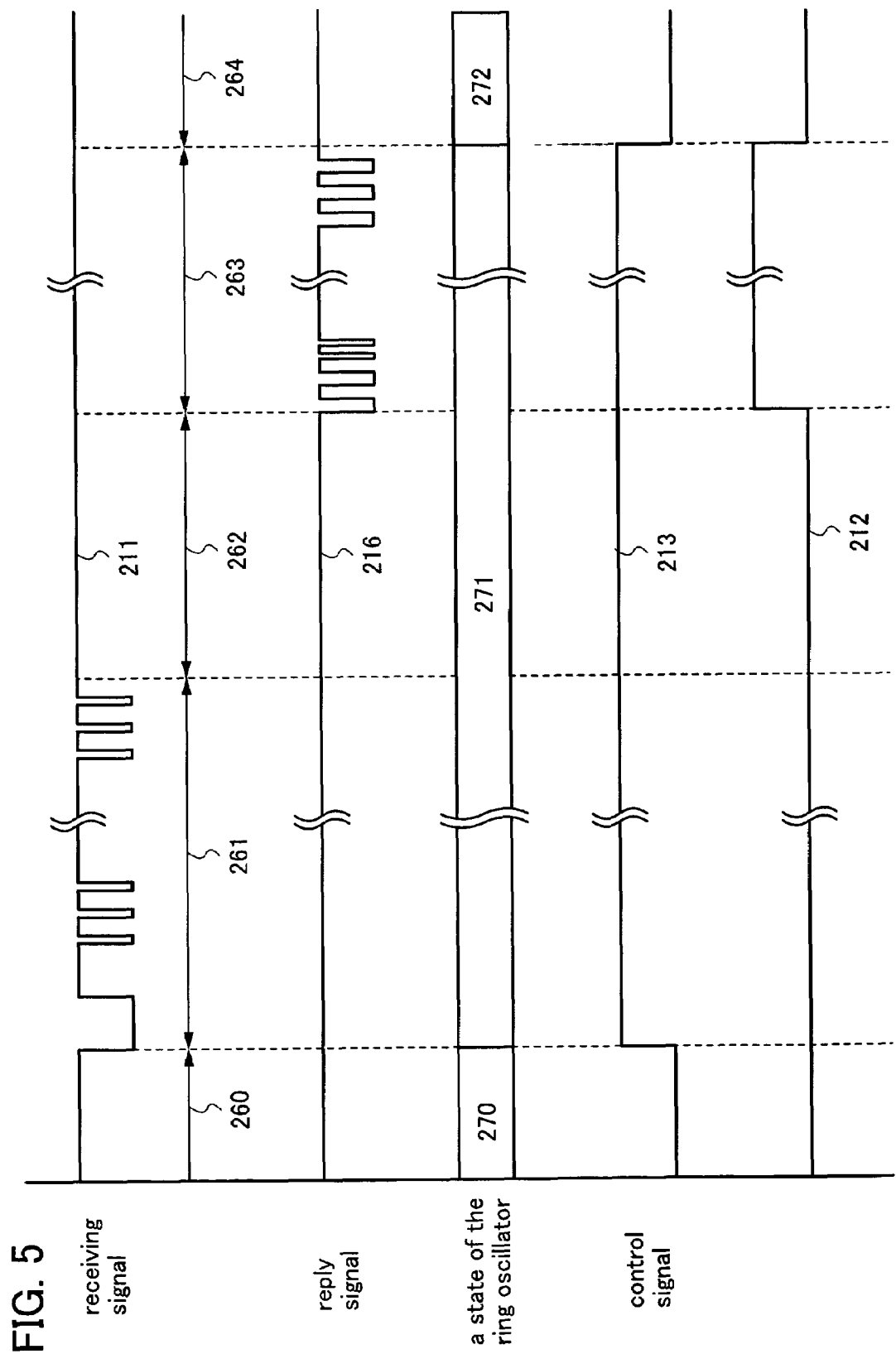
FIG. 5 is a chart describing an operation method of a semiconductor device of the present invention.

Next, the operation of the semiconductor device is described using a timing chart in FIG. 5. Note that, in FIG. 5, the signal 211 which is output from the transmission and reception circuit 201, the reply signal 216 which is output from the logic circuit 202 to the transmission and reception circuit 201, the state of the ring oscillator 204, the control signal 213 which is output from the ring oscillator control circuit 203 to the ring oscillator 204, and the signal 212 which is output from the logic circuit 202 to the ring oscillator control circuit 203 are shown.

First, the semiconductor device 200 receives the signal 232 which is output from the external device 220. In a period 260, a signal formed only of a carrier wave is received as the signal 232. In this period, in the semiconductor device, the ring oscillator 204 does not operate, the clock signal 215 is not output, and the clock generation circuit 205 is stopped. Even in the period 260, for example, in the case where the semiconductor device 200 is used as a passive-type tag, power for driving the semiconductor device 200 is generated from the signal 232 received in the period 260. In addition, a circuit which does not need the clock signal 215 in order to operate can also be operated.

When an edge is detected with the edge detection circuit 241 in the signal 211 which is obtained through A/D conversion of the signal 232 received, in the transmission and reception control circuit 201, the level of the control signal 213 which is output from the ring oscillator control circuit 203 changes from low to high, and the state of the ring oscillator 204 changes from a stopped state 270 to an operating state 271 (period 261).

Next, after the period 261 during which the signal in which a carrier wave and a data signal are combined is received as the signal 232 which is output from the external device 220 is terminated, the semiconductor device 200 receives a signal including only a carrier wave, as the signal 232 (period 262). Note that, in the period 262, analysis processing and arithmetic processing of the signal 211 which is input to the logic circuit 202 are performed in the logic circuit 202 of the semiconductor device 200.

After that, the reply signal 216 is output from the logic circuit 202 to the transmission and reception control circuit 201 and the signal 217 is transmitted to the external device 220, so that the level of the signal 212 changes from low to high (period 263). When the transmission of the signal 217 from the semiconductor device 200 to the external device 220 is terminated, the level of the signal 212 changes from high to low, the level of the control signal 213 to be supplied to the ring oscillator 204 changes from high to low, and the operation of the ring oscillator 204 is stopped (the state of the ring oscillator 204 changes from the operating state 271 to a stopped state 272) (period 264). Thus, the clock signal 215 is not generated in the clock generation circuit 205 in the period 264.

As described above, generation of a clock signal is performed not during the whole period in which the semiconductor device receives a signal from the external device, but only during the period which a clock signal is needed for the operation of the semiconductor device, by operating the ring oscillator; accordingly, power consumption can be reduced.

Note that this embodiment mode can be combined with any structure of a semiconductor device described in another embodiment mode in this specification, as appropriate.

Embodiment Mode 3

Figure 6:
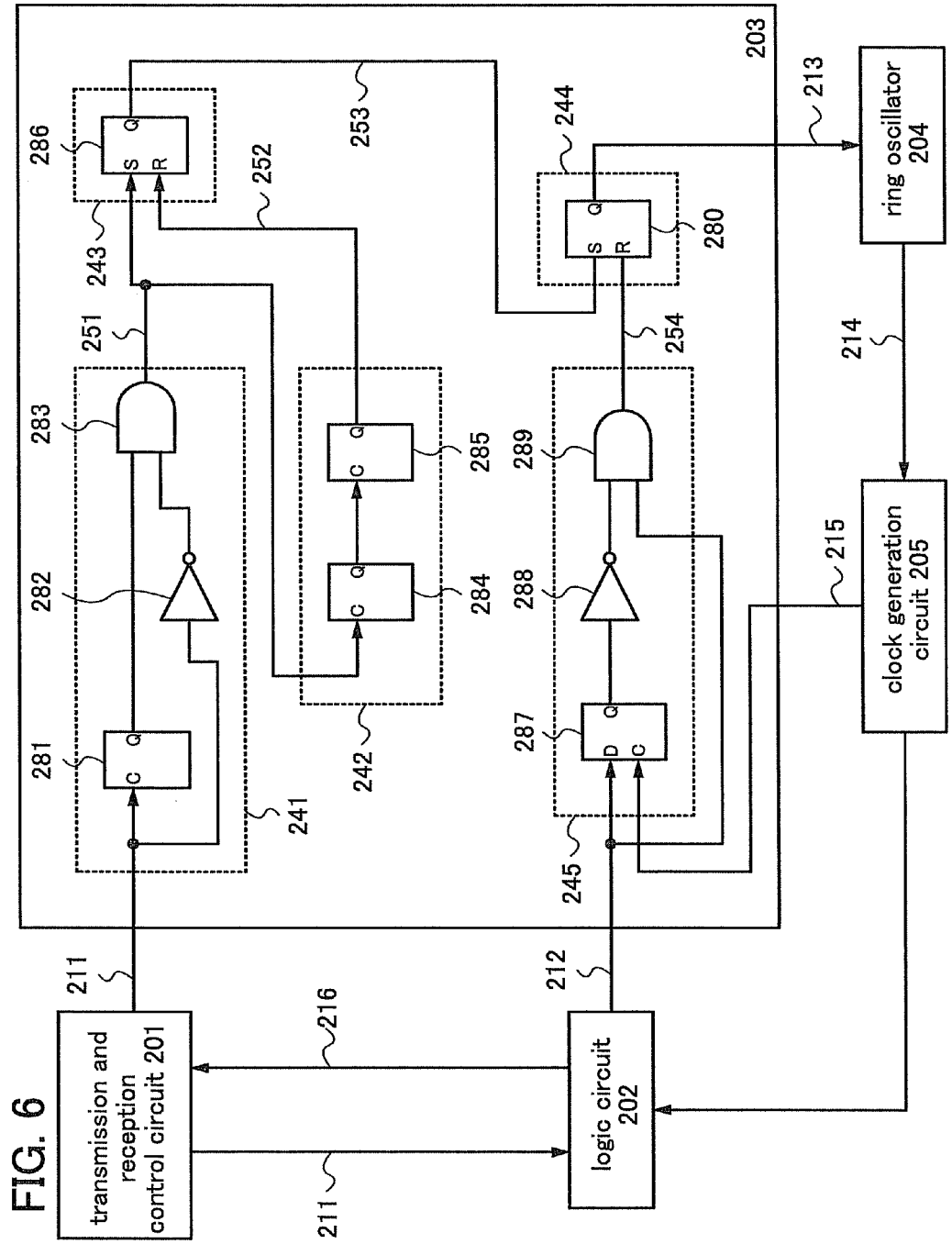
FIG. 6 is a diagram showing an example of a semiconductor device of the present invention.

In this embodiment mode, a specific structure of the ring oscillator control circuit of the semiconductor device described in the above embodiment mode is described using FIG. 6.

In the structure of the semiconductor device shown in FIG. 3, the edge detection circuit 241 may include a flip-flop circuit 281, an inverter circuit 282, and an AND circuit 283; the edge counter circuit 242 may include a flip-flop circuit 284 and a flip-flop circuit 285; the receiving signal decision circuit 243 may include a flip-flop circuit 286; the decision circuit 245 may include a flip-flop circuit 287, an inverter circuit 288, and an AND circuit 289; and the operation control circuit 244 may include a flip-flop circuit 280.

Note that, in FIG. 6, each of the flip-flop circuits 281, 284, and 285 has an input terminal of a clock (C) and an output terminal (Q); each of the flip-flop circuits 286 and 280 has input terminals of a set (S) and a reset (R) and an output terminal (Q); and the flip-flop circuit 287 has input terminals of D and a clock (C) and an output terminal (Q). However, the present invention is not limited to this structure.

For example, the edge counter circuit 242 may include a counter circuit instead of the flip-flop circuits 284 and 285, as well.

Hereinafter, an operation of the semiconductor device 200 is described using FIG. 6. Note that the following description is made on the case where the semiconductor device 200 receives a signal transmitted from the external device 220 and transmits a reply signal to the external device 220.

When the semiconductor device receives the signal which is output from the external device to the transmission and reception control circuit 201, the signal 211 is input to the flip-flop circuit 281 and the inverter circuit 282 of the edge detection circuit 241. By comparing a signal which is output from the flip-flop circuit 281 and a signal which is output from the inverter circuit 282, using the AND circuit 283, an edge included in the signal 211 received is detected. After that, the signal 251 which is output from the AND circuit 283 is input to the flip-flop circuit 286 as a set signal.

Note that the signal 251 which is output from the AND circuit 283 is also input to the input terminal of a reset (R) of the flip-flop circuit 286 as the signal 252 through the flip-flop circuits 284 and 285 of the edge counter circuit 242.

Next, the signal 253 which is output from the flip-flop circuit 286 is input to the flip-flop circuit 280 of the operation control circuit 244 as a set signal, so that the signal 213 to be output from the flip-flop circuit 280 is changed. Consequently, the state of the ring oscillator 204 changes from the stopped state to an oscillating state (the operation starts).

When the ring oscillator 204 is made in the oscillating state, the clock signal 215 is generated in the clock generation circuit 205 and supplied to the logic circuit 202 and the flip-flop circuit 287 of the decision circuit 245. Further, the signal 212 which is output from the logic circuit 202 is input to the flip-flop circuit 287 of the decision circuit 245.

A signal which is output from the flip-flop circuit 287 is input to the AND circuit 289 through the inverter circuit 288. Then, by comparing the signal and the signal 212 which is output from the logic circuit 202, in the AND circuit 289, termination of transmission of the reply signal 216 which is output from the logic circuit 202, to the external device is detected. After that, a signal 254 which is output from the AND circuit 289 is input to the input terminal of a reset (R) of the flip-flop circuit 280. Consequently, the signal 213 which is output from the flip-flop circuit 280 changes so that the state of the ring oscillator 204 changes from the oscillating state to the stopped state and the output of the clock signal 215 from the clock generation circuit 205 is stopped.

As described above, generation of a clock signal is performed not during the whole period in which the semiconductor device receives a signal from the external device, but only during the period which a clock signal is needed for the operation of the semiconductor device (the period from the start of detection of an edge in a receiving signal to termination of transmission of a reply signal), by operating the ring oscillator; accordingly, power consumption can be reduced.

Note that this embodiment mode can be combined with any structure of a semiconductor device described in another embodiment mode in this specification, as appropriate.

Embodiment Mode 4

In this embodiment mode, a structure of the semiconductor device described in any of the above embodiment modes is described using a drawing.

Figure 7:
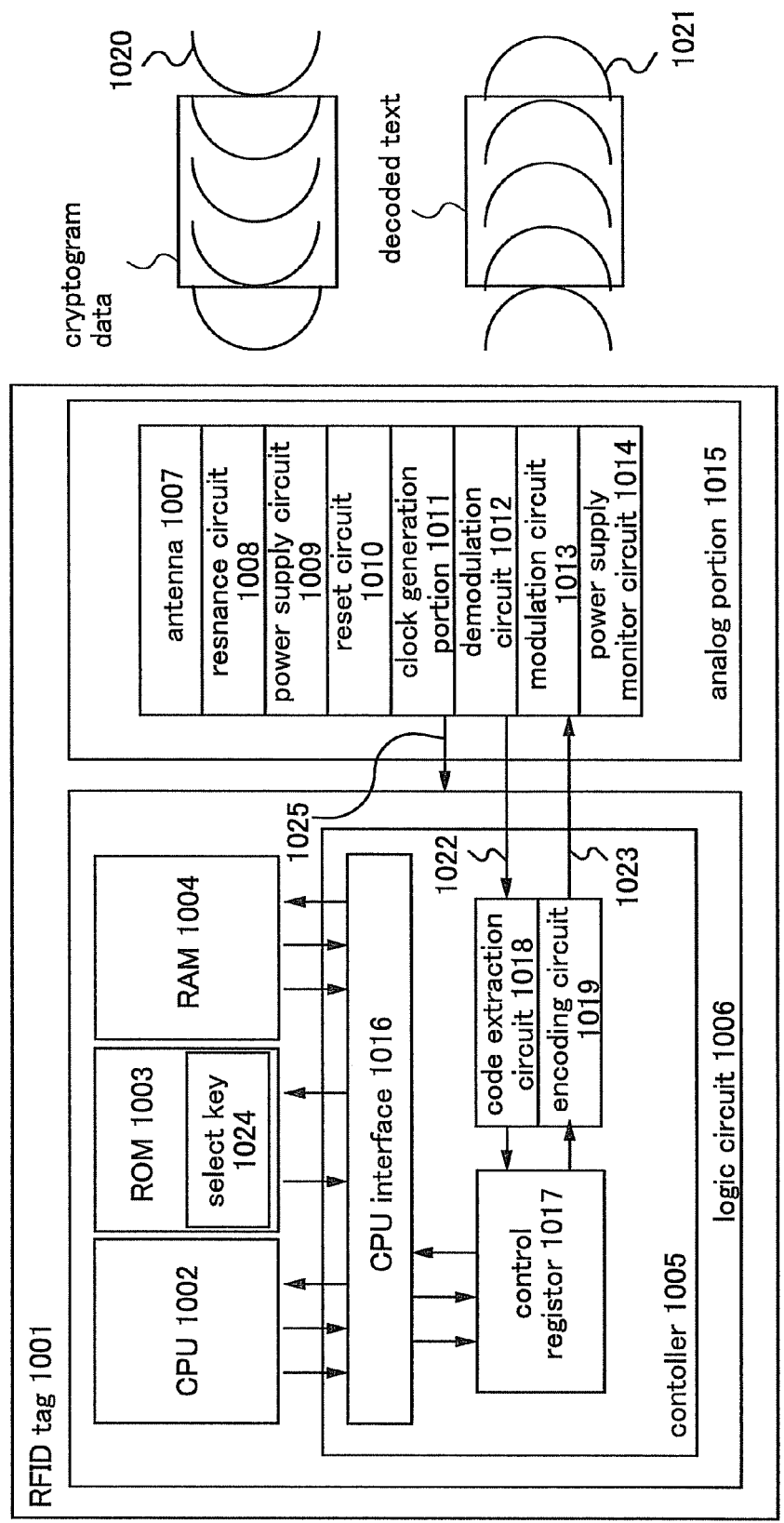
FIG. 7 is a diagram showing an example of a semiconductor device of the present invention.
Figure 8A:
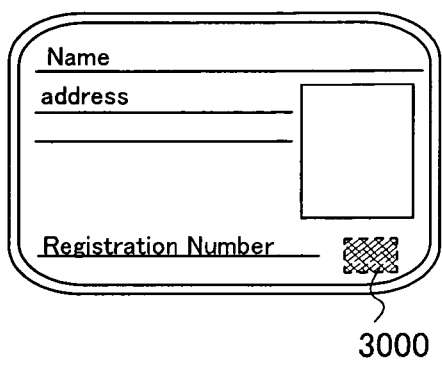
FIGS. 8A to 8F are diagrams each showing an example of a usage example of a semiconductor device of the present invention.
Figure 8B:
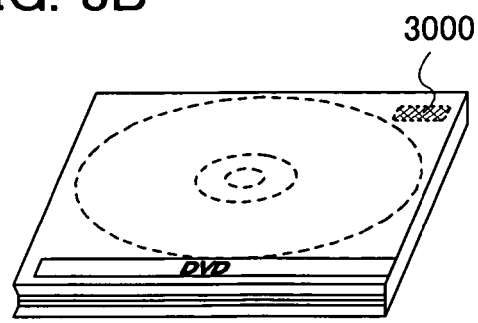
Figure 8C:
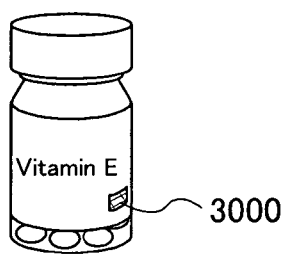
Figure 8D:
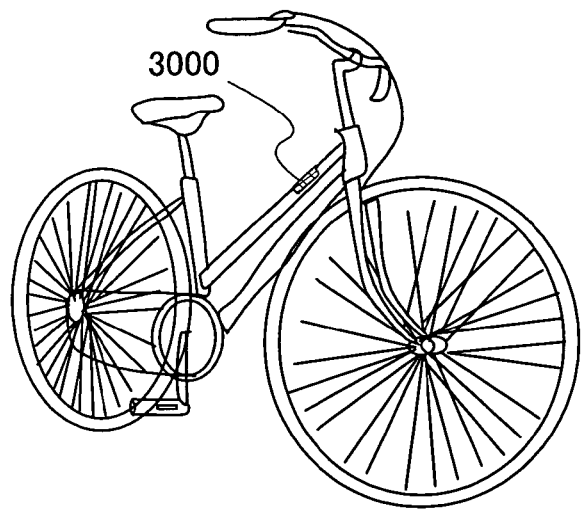
Figure 8E:
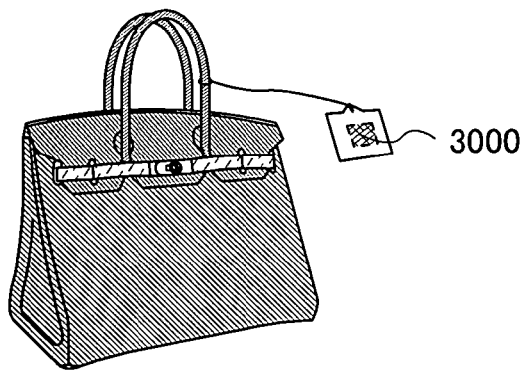
Figure 8F:
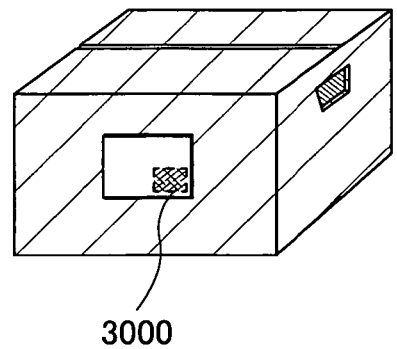

First, a block structure of the semiconductor device described in this embodiment mode is described using FIG. 7. In FIG. 7, a semiconductor device such as an RFID tag, hereinafter referred to as an RFID tag 1001, includes a logic circuit 1006 including a CPU 1002, a ROM 1003, a RAM 1004, and a controller 1005, and an analog portion 1015 including an antenna 1007, a resonant circuit 1008, a power supply circuit 1009, a reset circuit 1010, a clock generation portion 1011, a demodulation circuit 1012, a modulation circuit 1013, and a power supply monitor circuit 1014. In FIG. 7, the transmission and reception control circuit shown in FIG. 1 may include the demodulation circuit 1012 and the modulation circuit 1013, and the ring oscillator control circuit 203, the ring oscillator 204, and the clock generation circuit 205 may be provided in the clock generation portion 1011.

The controller 1005 includes a CPU interface (CPUIF) 1016, a control register 1017, a code extraction circuit 1018, and an encoding circuit 1019. Note that, although a receiving signal 1020 and a transmitting signal 1021 are separately shown as a communication signal in FIG. 7 for simple description, in practice, they are a unified signal and are communicated between the RFID tag 1001 and a reader/writer at the same time. The receiving signal 1020 is received with the antenna 1007 and the resonance circuit 1008, and then, demodulated by the demodulation circuit 1012. Further, the transmitting signal 1021 is modulated by the modulation circuit 1013, and then, transmitted from the antenna 1007.

In FIG. 7, when the RFID tag 1001 is disposed in a magnetic field formed by the communication signal, an induced electromotive force is generated by the antenna 1007 and the resonance circuit 1008. The induced electromotive force is held by the electrical capacitance in the power supply circuit 1009, and the potential thereof is stabilized by the electrical capacitance and supplied to each circuit of the RFID tag 1001 as a supply voltage. The reset circuit 1010 generates an initial reset signal for the whole RFID tag 1001. For example, a signal which rises with delay following increase in the supply voltage is generated as a reset signal. The clock generation portion 1011 can have a structure in which the frequency and duty ratio of a clock signal are changed in accordance with a control signal generated by the power supply monitor circuit 1014. The demodulation circuit 1012 detects a change of the amplitude of the receiving signal 1020 which is ASK modulated, as a reception data 1022 of '0' or '1'. The demodulation circuit 1012 is, for example, a low pass filter. Further, the modulation circuit 1013 transmits transmission data by changing the amplitude of the ASK modulated transmitting signal 1021. For example, when a transmission data 1023 is '0', the point of resonance of the resonant circuit 1008 is changed to change the amplitude of the communication signal. The power supply monitor circuit 1014 monitors the supply voltage which is supplied from the power supply circuit 1009 to the logic circuit 1006 or power consumption of the logic circuit 1006, and generates the control signal such that the frequency and duty ratio of a clock signal is changed in the clock generation portion 1011.

An operation of the RFID tag of this embodiment mode is described below. First, the receiving signal 1020 including cryptogram data is transmitted from the reader/writer and received by the RFID tag 1001. The receiving signal 1020 is demodulated with the demodulation circuit 1012, decomposed into a control command, a cryptogram data, or the like with the code extraction circuit 1018, and stored into the control register 1017. Note that the control command is data for specifying a reply of the RFID tag 1001. For example, transmission of a unique ID number, an operation stop, cryptanalysis, or the like is specified. Described here is the example in which the control command for cryptanalysis is received. Note that, when an edge is detected from the receiving signal 1020 in the clock generation portion 1011, a clock signal 1025 is output from the clock generation portion 1011 to the logic circuit 1006.

Subsequently, in the logic circuit 1006, the CPU 1002 deciphers (decodes) a cryptogram by using a secret key 1024 which has been stored in the ROM 1003 in accordance with a decryption program stored in the ROM 1003. The decoded cryptogram (decoded text) is stored in the control register 1017. At this time, the RAM 1004 is used as a data storing region. Note that the CPU 1002 accesses the ROM 1003, the RAM 1004, and the control register 1017 via the CPUIF 1016. The CPUIF 1016 has a function of generating an access signal with respect to any one of the ROM 1003, the RAM 1004, and the control register 1017 in accordance with an address which the CPU 1002 requests.

Filially, in the encoding circuit 1019, the transmission data 1023 is generated from the decoded text and modulated by the modulation circuit 1013, and the transmitting signal 1021 is transmitted to the reader/writer from the antenna 1007. After that, output of the clock signal from the clock generation portion 1011 is stopped.

Note that, although this embodiment mode describes the method of processing data by using software, that is, the method, in which an arithmetic circuit is formed of a CPU and a large-scale memory, of running program by the CPU, as an arithmetic method; however, the arithmetic method may be selected in accordance with the purpose. For example, as the arithmetic method, there are a method of processing an arithmetical operation by using hardware and a method of processing an arithmetical operation by using both hardware and software. In the method of processing an arithmetical operation by using hardware, an arithmetic circuit may include a dedicated circuit. In the method of processing an arithmetical operation by using both hardware and software, an arithmetic circuit may include a dedicated circuit, a CPU, and a memory; the dedicated circuit performs part of arithmetic processing, and the CPU runs a program of the other arithmetic processing.

Note that this embodiment mode can be combined with any structure of a semiconductor device described in another embodiment mode in this specification, as appropriate.

Embodiment Mode 5

In this embodiment mode, one example of a method for manufacturing the semiconductor device described in any of the above embodiment modes is described. Described in this embodiment mode is a structure in which a semiconductor device including an antenna circuit is provided over one substrate.

First, as shown in FIG. 9A, a separation layer 1903 is formed over one surface of a substrate 1901 with an insulating film 1902 interposed therebetween, and then an insulating film 1904 which functions as a base film and a semiconductor film (e.g., a film containing amorphous silicon) 1905 are stacked thereover. Note that the insulating film 1902, the separation layer 1903, the insulating film 1904, and the semiconductor film 1905 can be formed consecutively.

Note that the substrate 1901 is a substrate selected from a glass substrate, a quartz substrate, a metal substrate (e.g. a stainless steel substrate), a ceramic substrate, a semiconductor substrate such as a Si substrate, and the like. Further, a plastic substrate made of polyethylene terephthalate (PET), polyethylene naphthalate (PEN), polyether sulfone (PES), acrylic, or the like can be used as well. Note that, although the separation layer 1903 is provided over the entire surface of the substrate 1901 with the insulating film 1902 interposed therebetween in this process, the separation layer 1903 can also be selectively formed by a photolithography method after being provided over the entire surface of the substrate 1901, as necessary.

Further, each of the insulating films 1902 and 1904 is formed of a material such as silicon oxide, silicon nitride, silicon oxynitride ($SiO_xN_y$, where x>y>0), or silicon nitride oxide ($SiN_xO_y$ where x>y>0) by a CVD method, a sputtering method, or the like. For example, in the case where each of the insulating films 1902 and 1904 is formed to have a two-layer structure, a silicon nitride oxide film may be formed as a first-layer insulating film and a silicon oxynitride film may be formed as a second-layer insulating film. Alternatively, a silicon nitride film may be formed as a first-layer insulating film and a silicon oxide film may be formed as a second-layer insulating film. The insulating film 1902 functions as a blocking layer which prevents an impurity element contained in the substrate 1901 from getting mixed into the separation layer 1903 or elements formed thereover. The insulating film 1904 functions as a blocking layer which prevents an impurity element contained in the substrate 1901 or the separation layer 1903 from getting mixed into elements formed over the insulating film 1904. In this manner, formation of the insulating films 1902 and 1904 which function as blocking layers can prevent adverse effects on the elements formed thereover, caused by an alkali metal such as Na or an alkaline earth metal contained in the substrate 1901 or by the impurity element contained in the separation layer 1903. Note that, when quartz is used for the substrate 1901, the insulating film 1902 may be omitted.

Further, the separation layer 1903 can be formed of a metal film, a stacked-layer structure of a metal film and a metal oxide film, or the like. As the metal film, either a single layer or stacked layers is/are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as its main component. Further, such a material can be deposited by a sputtering method, a CVD method such as a plasma CVD method, or the like. The stacked-layer structure of a metal film and a metal oxide film can be obtained as follows; the above-mentioned metal film is formed, and plasma treatment under an oxygen atmosphere or an $N_2O$ atmosphere or heat treatment under an oxygen atmosphere or an $N_2O$ atmosphere is performed thereon to provide oxide or oxynitride of the metal film on the surface of the metal film. For example, when a tungsten film is provided as the metal film by a sputtering method, a CVD method, or the like, a metal oxide film of tungsten oxide can be formed on the surface of the tungsten film by application of plasma treatment to the tungsten film. Alternatively, for example, after the metal film (e.g., tungsten) is formed, an insulating film formed of silicon oxide ($SiO_2$) or the like may be formed over the metal film by a sputtering method, and also metal oxide (e.g., tungsten oxide on tungsten) may be formed on the metal film. Further, high-density plasma treatment may be performed as the plasma treatment, for example. Further, metal nitride or metal oxynitride may also be formed as well as the metal oxide film. In this case, plasma treatment or heat treatment may be performed on the metal film under a nitrogen atmosphere or an atmosphere containing nitrogen and oxygen.

Further, the semiconductor film 1905 is formed with a thickness of 25 to 200 nm (preferably, 30 to 150 nm) by a sputtering method, an LPCVD method, a plasma CVD method, or the like.

Next, as shown in FIG. 9B, the semiconductor film 1905 is crystallized by laser irradiation. Note that the crystallization of the semiconductor film 1905 may be performed by a method combining the laser irradiation with a thermal crystallization method using RTA or an annealing furnace or with a thermal crystallization method using a metal element which promotes crystallization, as well. After that, the crystalline semiconductor film obtained is etched into a desired shape, whereby crystallized crystalline semiconductor films 1905a to 1905f are formed. Then, a gate insulating film 1906 is formed so as to cover the semiconductor films 1905a to 1905f.

Note that the gate insulating film 1906 is formed of a material such as silicon oxide, silicon nitride, silicon oxynitride ($SiO_xN_y$ where x>y>0), or silicon nitride oxide ($SiN_xO_y$ where x>y>0) by a CVD method, a sputtering method, or the like. For example, in the case where the gate insulating film 1906 is formed to have a two-layer structure, a silicon oxynitride film may be formed as a first-layer insulating film and a silicon nitride oxide film may be formed as a second-layer insulating film. Alternatively, a silicon oxide film may be formed as a first-layer insulating film and a silicon nitride film may be formed as a second-layer insulating film.

An example of a formation process of the crystallized semiconductor films 1905a to 1905f is briefly described below. First, an amorphous semiconductor film with a thickness of 50 to 60 nm is formed by a plasma CVD method. Then, a solution containing nickel which is a metal element which promotes crystallization is retained on the amorphous semiconductor film, and dehydrogenation treatment (at 500° C. for 1 hour) and thermal crystallization treatment (at 550° C. for 4 hours) are performed thereon, so that a crystalline semiconductor film is formed. Then, the crystalline semiconductor film is subjected to laser irradiation and a photolithography process to form the crystalline semiconductor films 1905a to 1905f. Note that the crystallization of the amorphous semiconductor film may be performed only by laser irradiation without performing thermal crystallization using a metal element which promotes crystallization, as well.

Note that, as a laser oscillator used for the crystallization, either a continuous wave laser oscillator (a CW laser oscillator) or a pulsed laser oscillator can be used. As a laser that can be used here, there are a gas laser such as an Ar laser, a Kr laser, or an excimer laser; a laser whose medium is single-crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. By irradiation with the fundamental wave or any of the second to fourth harmonics of such a laser beam, crystals with a large grain size can be obtained. For example, the second harmonic (532 nm) or the third harmonic (355 nm) of an Nd:$YVO_4$ laser (the fundamental wave of 1064 nm) can be used. In this case, a laser power density of about 0.01 to 100 $MW/cm^2$ (preferably, 0.1 to 10 $MW/cm^2$) is needed, and irradiation is performed with a scanning rate of about 10 to 2000 cm/sec. Note that the laser whose medium is single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; an Ar ion laser; or a Ti:sapphire laser can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with the next pulse during the period for solidifying the semiconductor film which has been melted by the laser beam. Therefore, unlike the case of using a pulsed laser with a small repetition rate, a solid-liquid interface in the semiconductor film can be continuously moved. Thus, crystal grains which have grown continuously in the scanning direction can be obtained.

Further, the gate insulating film 1906 may be formed by oxidization or nitridation of the surfaces of the semiconductor films 1905a to 1905f by the above-described high-density plasma treatment, as well. For example, plasma treatment with a mixed gas of a rare gas such as He, Ar, Kr, or Xe, and oxygen, nitrogen oxide ($NO_2$), ammonia, nitrogen, or hydrogen is performed. In this case, when plasma is excited by introduction of microwaves, plasma with a low electron temperature and high density can be generated. With oxygen radicals (which may include OH radicals) or nitrogen radicals (which may include NH radicals) which are generated by the high-density plasma, a surface of a semiconductor film can be oxidized or nitrided.

By such high-density plasma treatment, an insulating film with a thickness of 1 to 20 nm, typically 5 to 10 nm, is formed on the semiconductor film. Since the reaction in this case is a solid-phase reaction, the interface state density between the insulating film and the semiconductor film can be quite low. Since such high-density plasma treatment directly oxidizes (or nitrides) the semiconductor film (crystalline silicon or polycrystalline silicon), the insulating film can be formed with quite less variation of thickness. In addition, since crystal grain boundaries of crystalline silicon are not strongly oxidized, an excellent state is obtained. That is, by the solid-phase oxidation of a surface of a semiconductor film by the high-density plasma treatment described in this embodiment mode, an insulating film with a uniform thickness and low interface state density can be formed without excessive oxidation reaction at the crystal grain boundaries.

Note that, as the gate insulating film 1906, only an insulating film formed by high-density plasma treatment may be used, or a stacked layer which is obtained by deposition of an insulating film made of silicon oxide, silicon oxynitride, or silicon nitride on the insulating film by a CVD method using plasma or thermal reaction may be used. In either case, transistors each including such an insulating film formed by high-density plasma treatment in a part or the whole of a gate insulating film can have less variation of properties.

Further, the semiconductor films 1905a to 1905f, which are obtained by irradiation of a semiconductor film with a continuous wave laser beam or a laser beam oscillated with a repetition rate of 10 MHz or more while scanning the semiconductor film with the laser beam in one direction to crystallize the semiconductor film, have a characteristic in that crystals grow in the beam scanning direction. When transistors are arranged so that the channel length direction (direction in which carriers move when a channel is formed) is aligned with the scanning direction and the above-described gate insulating film 1906 is combined, thin film transistors (TFTs) with high field effect mobility, which have less variation of properties can be obtained.

Next, a first conductive film and a second conductive film are stacked over the gate insulating film 1906. Here, the first conductive film is formed with a thickness of 20 to 100 nm by a CVD method, a sputtering method, or the like. The second conductive film is formed with a thickness of 100 to 400 nm. Each of the first conductive film and the second conductive film is formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component. Further, a semiconductor material typified by polycrystalline silicon doped with an impurity element such as phosphorus may be used as well. Examples of combination of the first conductive film and the second conductive film are as follows: a tantalum nitride film and a tungsten film, a tungsten nitride film and a tungsten film, a molybdenum nitride film and a molybdenum film, and the like. Tungsten and tantalum nitride have high heat resistance; therefore, after forming the first conductive film and the second conductive film, heat treatment for the purpose of thermal activation can be performed thereon. Further, in the case where a two-layer structure is not employed, but a three-layer structure is employed, a stacked-layer structure of a molybdenum film, an aluminum film, and a molybdenum film may be used.

Next, a resist mask is formed by a photolithography method, and etching treatment is performed to form gate electrodes and gate lines, whereby gate electrodes 1907 are formed over the semiconductor films 1905a to 1905f. Described here is the case where a stacked-layer structure of a first conductive film 1907a and a second conductive film 1907b is employed as each gate electrode 1907.

Next, as shown in FIG. 9C, the semiconductor films 1905a to 1905f are doped with an n-type impurity element at low concentration, using the gate electrodes 1907 as masks by an ion doping method or an ion implantation method. Then, a resist mask is selectively formed by a photolithography method, and the semiconductor films 1905c and 1905e are doped with a p-type impurity element at high concentration. As the n-type impurity element, phosphorus (P), arsenic (As), or the like can be used. As the p-type impurity element, boron (B), aluminum (Al), gallium (Ga), or the like can be used. In this embodiment mode, phosphorus (P) is used as the n-type impurity element and is selectively introduced into the semiconductor films 1905a to 1905f so as to be contained at concentrations of $1 \times 10^{15}$ to $1 \times 10^{19}/cm^3$, whereby n-type impurity regions 1908 are formed. In addition, boron (B) is used as the p-type impurity element, and is selectively introduced into the semiconductor films 1905c and 1905e so as to be contained at concentrations of $1 \times 10^{19}$ to $1 \times 10^{20}/cm^3$, whereby p-type impurity regions 1909 are formed.

Next, an insulating film is formed so as to cover the gate insulating film 1906 and the gate electrodes 1907. The insulating film is formed of either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching mainly in the perpendicular direction, so that insulating films (also called sidewalls) 1910 which are in contact with the side surfaces of the gate electrodes 1907 are formed. The insulating films 1910 are used as masks in doping for forming LDD (Lightly Doped Drain) regions.

Next, the semiconductor films 1905a, 1905b, 1905d, and 1905f are doped with an n-type impurity element at high concentration, using resist masks formed by a photolithography method, the gate electrodes 1907, and the insulating films 1910 as masks, whereby n-type impurity regions 1911 are formed. In this embodiment mode, phosphorus (P) is used as the n-type impurity element, and is selectively introduced into the semiconductor films 1905a, 1905b, 1905d, and 1905f so as to be contained at concentrations of $1 \times 10^{19}$ to $1 \times 10^{20}/cm^3$, whereby the n-type impurity regions 1911 with higher concentration of impurity than the impurity regions 1908 are formed.

Through the above process, as shown in FIG. 9D, n-channel thin film transistors 1900a, 1900b, 1900d, and 1900f, and p-channel thin film transistors 1900c and 1900e are formed.

Note that, in the n-channel thin film transistor 1900a, a channel formation region is formed in a region of the semiconductor film 1905a, which overlaps with the gate electrode 1907; the impurity regions 1911 which function as a source and drain region are formed in regions of the semiconductor film 1905a, which do not overlap with the gate electrode 1907 and the insulating film 1910; and low concentration impurity regions (LDD regions) are formed in regions of the semiconductor film 1905a, which overlap with the insulating film 1910, between the channel formation region and the impurity regions 1911. Similarly, channel formation regions, low concentration impurity regions, and the impurity regions 1911 are formed in the n-channel thin film transistors 1900b, 1900d, and 1900f.

Further, in the p-channel thin film transistor 1900c, a channel formation region is formed in a region of the semiconductor film 1905c, which overlaps with the gate electrode 1907, and the impurity regions 1909 which function as a source and drain region are formed in regions of the semiconductor film 1905c, which do not overlap with the gate electrode 1907. Similarly, a channel formation region and the impurity regions 1909 are formed in the p-channel thin film transistor 1900e. Note that, although LDD regions are not formed in the p-channel thin film transistors 1900c and 1900e in this embodiment mode, LDD regions may be provided in any of the p-channel thin film transistors or a structure without LDD regions may be employed for each of the n-channel thin film transistors.

Figure 10A:
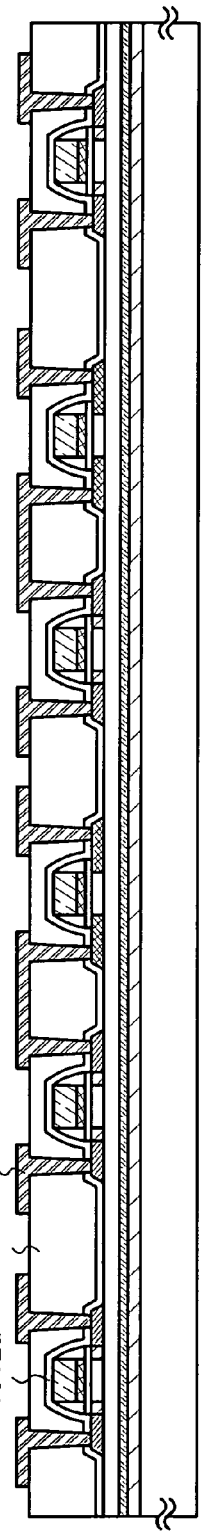
FIGS. 10A to 10C are diagrams showing an example of a manufacturing method of a semiconductor device of the present invention.

Next, as shown in FIG. 10A, an insulating film with a single layer structure or a stacked-layer structure is formed so as to cover the semiconductor films 1905a to 1905f, the gate electrodes 1907, and the like. Then, conductive films 1913 electrically connected to the impurity regions 1909 and 1911 which serve as source and drain regions of the thin film transistors 1900a to 1900f are formed over the insulating film. The insulating film is formed of a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. In this embodiment mode, the insulating film is formed to have a two-layer structure in which a silicon nitride oxide film is formed as a first-layer insulating film 1912a and a silicon oxynitride film is formed as a second-layer insulating film 1912b. Further, the conductive films 1913 form the source and drain electrodes of the thin film transistors 1900a to 1900f.

Note that, before the insulating films 1912a and 1912b are formed or after at least one of the insulating films 1912a and 1912b is formed, heat treatment is preferably performed for recovery of the crystallinity of the semiconductor films, activation of the impurity elements which have been added to the semiconductor films, or hydrogenation of the semiconductor films. As the heat treatment, thermal annealing, laser annealing, RTA, or the like may be applied.

Further, each of the conductive films 1913 is formed of a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component by a CVD method, a sputtering method, or the like. The alloy material containing aluminum as its main component corresponds to, for example, a material which contains aluminum as its main component and also contains nickel, or an alloy material which contains aluminum as its main component and also contains nickel and at least one of carbon and silicon. For each of the conductive films 1913, a stacked-layer structure of a barrier film, an aluminum silicon (Al—Si) film, and a barrier film or a stacked-layer structure of a barrier film, an aluminum silicon (Al—Si) film, a titanium nitride film, and a barrier film is preferably employed. Note that the 'barrier film' corresponds to a thin film formed of titanium, titanium nitride, molybdenum, or molybdenum nitride. Aluminum and aluminum silicon are suited for forming the conductive films 1913 because they have low resistance and are inexpensive. Further, when barrier layers are provided as the top layer and the bottom layer, generation of hillocks of aluminum or aluminum silicon can be prevented. Furthermore, when a barrier film is formed of titanium which is an element having a high reducing property, even if a thin natural oxide film is formed on the crystalline semiconductor film, the natural oxide film can be reduced, and a favorable contact between the conductive film 1913 and the crystalline semiconductor film can be obtained.

Next, an insulating film 1914 is formed so as to cover the conductive films 1913, and conductive films 1915a and 1915b electrically connected to the conductive films 1913 which form the source or drain electrodes of the thin film transistors 1900a and 1900f are formed over the insulating film 1914. In addition, conductive films 1916a and 1916b electrically connected to the conductive films 1913 which form the source or drain electrodes of the thin film transistors 1900b and 1900e are formed. Note that the conductive films 1915a and 1915b and the conductive films 1916a and 1916b may be formed of the same material at the same time. The conductive films 1915a and 1915b and the conductive films 1916a and 1916b can be formed of any of the above-described materials for the conductive films 1913.

Figure 10B:
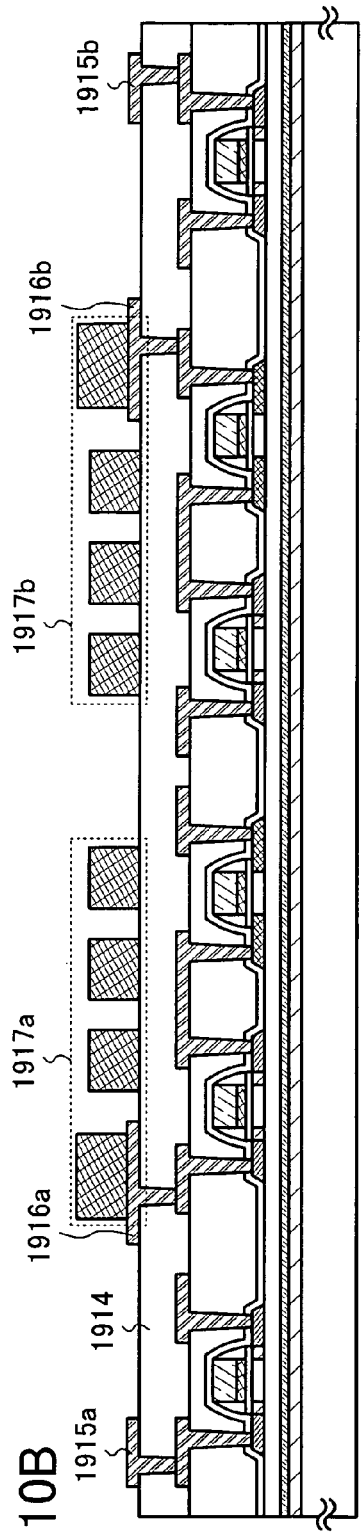

Then, as shown in FIG. 10B, conductive films 1917a and 1917b which function as antennas are formed so as to be electrically connected to the conductive films 1916a and 1916b respectively.

Note that the insulating film 1914 can be formed of a single layer or a stacked layer of an insulating film containing oxygen and/or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like. Note that the siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent. Further alternatively, both a fluoro group and an organic group containing at least hydrogen may be used as the substituent.

Each of the conductive films 1917a and 1917b is formed of a conductive material by a CVD method, a sputtering method, a printing method such as screen printing or gravure printing, a droplet discharging method, a dispenser method, a plating method, or the like. The conductive films 1917a and 1917b are each formed of a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as its main component.

For example, when the conductive films 1917a and 1917b which function as antennas are formed by a screen printing method, the conductive films 1917a and 1917b can be provided by selective printing of a conductive paste in which conductive particles with a grain diameter of several nanometers to several tens of micrometers are dissolved or dispersed in an organic resin. The conductive particles can be at least one or more of metal particles selected from silver (Ag), gold (Au), copper (Cu), nickel (Ni), platinum (Pt), palladium (Pd), tantalum (Ta), molybdenum (Mo), titanium (Ti), and the like; fine particles of silver halide; or dispersive nanoparticles thereof. Further, the organic resin included in the conductive paste can be one or more of organic resins which function as a binder, a solvent, a dispersing agent, and a coating material of the metal particles; typically, an organic resin such as an epoxy resin and a silicone resin can be given as an example. For formation of the conductive films, it is preferable to perform baking after the conductive paste is applied. For example, when fine particles (e.g., a grain diameter of 1 to 100 nm) containing silver as its main component are used as a material of the conductive paste, the conductive paste is baked to be hardened at temperatures of 150 to 300° C., so that the conductive films can be obtained. Further, it is also possible to use fine particles containing solder or lead-free solder as its main component. In this case, fine particles with a grain diameter of 20 µm or less are preferably used. Solder and lead-free solder have the advantage of low cost and the like.

Figure 10C:
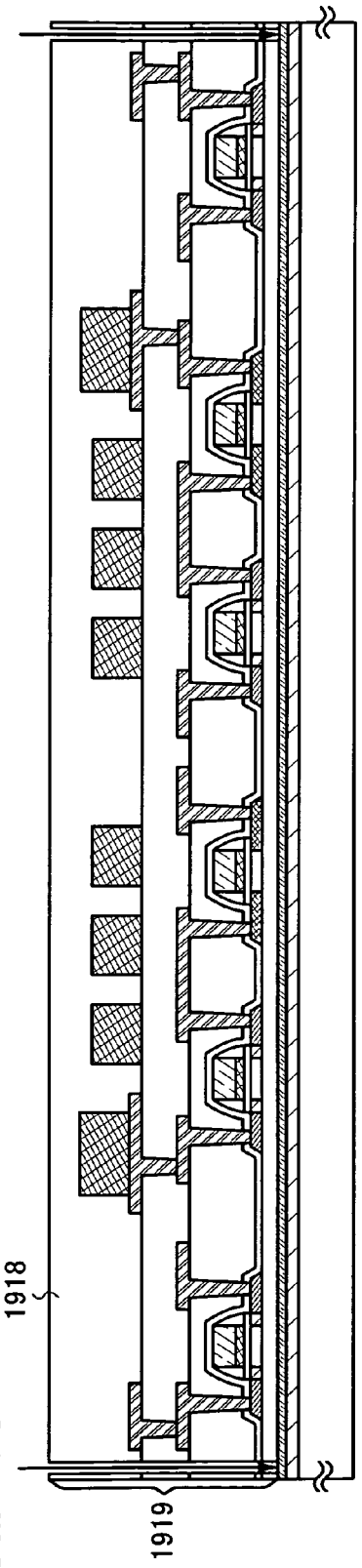

Next, as shown in FIG. 10C, an insulating film 1918 is formed so as to cover the conductive films 1917a and 1917b, a layer including the thin film transistors 1900a to 1900f, the conductive films 1917a and 1917b, and the like (hereinafter referred to as an 'element formation layer 1919') is separated from the substrate 1901. In this embodiment mode, openings are formed in the element formation layer 1919 excluding the regions of the thin film transistors 1900a to 1900f by laser irradiation (e.g., with UV light irradiation), and the element formation layer 1919 can be separated from the substrate 1901 with a physical force. Further, the separation layer 1903 may be selectively removed by introduction of an etchant into the openings before the element formation layer 1919 is separated from the substrate 1901. As the etchant, a gas or a liquid containing halogen fluoride or halide is used. For example, when chlorine trifluoride ($ClF_3$) is used as the gas containing halogen fluoride, the element formation layer 1919 is separated from the substrate 1901. Note that the whole separation layer 1903 does not necessarily be removed but part thereof may be left; accordingly, the consumption of the etchant can be suppressed and process time taken to remove the separation layer can be shortened, and even after removing the separation layer 1903, the element formation layer 1919 can be held above the substrate 1901. Further, by reuse of the substrate 1901 from which the element formation layer 1919 has been separated, cost reduction can be achieved.

The insulating film 1918 can be formed of a single layer or a stacked layer of an insulating film containing oxygen and/or nitrogen such as silicon oxide ($SiO_x$), silicon nitride ($SiN_x$), silicon oxynitride ($SiO_xN_y$ where x>y>0), or silicon nitride oxide ($SiN_xO_y$ where x>y>0); a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like.

In this embodiment mode, as shown in FIG. 11A, after forming the openings in the element formation layer 1919 by laser irradiation, a first sheet material 1920 is attached to one surface of the element formation layer 1919 (the surface where the insulating film 1918 is exposed), and then the element formation layer 1919 is separated from the substrate 1901.

Next, as shown in FIG. 11B, a second sheet material 1921 is attached to the other surface of the element formation layer 1919 (the surface exposed by the separation), and one or both of heat treatment and pressurization treatment for attachment of the second sheet material 1921 is performed thereon. A hot-melt film or the like can be used as each of the first sheet material 1920 and the second sheet material 1921.

Further, as each of the first sheet material 1920 and the second sheet material 1921, a film on which antistatic treatment for preventing static electricity or the like has been applied (hereinafter referred to as an antistatic film) can be used as well. As examples of the antistatic film, a film in which an antistatic material is dispersed in a resin, a film to which an antistatic material is attached, and the like can be given. The film provided with an antistatic material can be a film with an antistatic material provided on one surface, or a film with antistatic materials provided on both surfaces. The film with an antistatic material provided on one surface may be attached to the layer so that the antistatic material is placed on the inner side of the film or the outer side of the film. The antistatic material may be provided over the entire surface of the film or over a part of the film. As the antistatic material, a metal, indium tin oxide (ITO), or a surfactant such as an amphoteric surfactant, a cationic surfactant, or a nonionic surfactant can be used. Further, as the antistatic material, a resin material which contains a cross-linked copolymer having a carboxyl group and a quaternary ammonium base on its side chain, or the like can be used. Such a material is attached, mixed, or applied to a film, so that the antistatic film can be formed. The element formation layer is sealed using the antistatic film, so that the semiconductor elements can be protected from adverse effects such as external static electricity when dealt with as a commercial product.

Further, although the case where the element formation layer 1919 is separated from the substrate 1901 is described in this embodiment mode, the element formation layer 1919 may be formed over the substrate 1901 without providing the separation layer 1903 so that a semiconductor device is completed, as well. Note that, when an SOI (silicon on insulator) substrate is used as the substrate 1901, a single crystalline semiconductor film may be used as the semiconductor film, and the time taken for the step of crystallizing a semiconductor film can be eliminated.

As described above, according to the manufacturing method of this embodiment mode, a semiconductor device which is small, has flexibility in physical shape, and is capable of stable operation can be provided.

Note that this embodiment mode can be combined with any structure of a semiconductor device described in another embodiment mode in this specification, as appropriate.

Embodiment Mode 6

In this embodiment mode, an example of manufacturing the semiconductor device described in any of the above embodiment modes, using transistors formed using a single crystalline substrate is described.

Figure 12A:
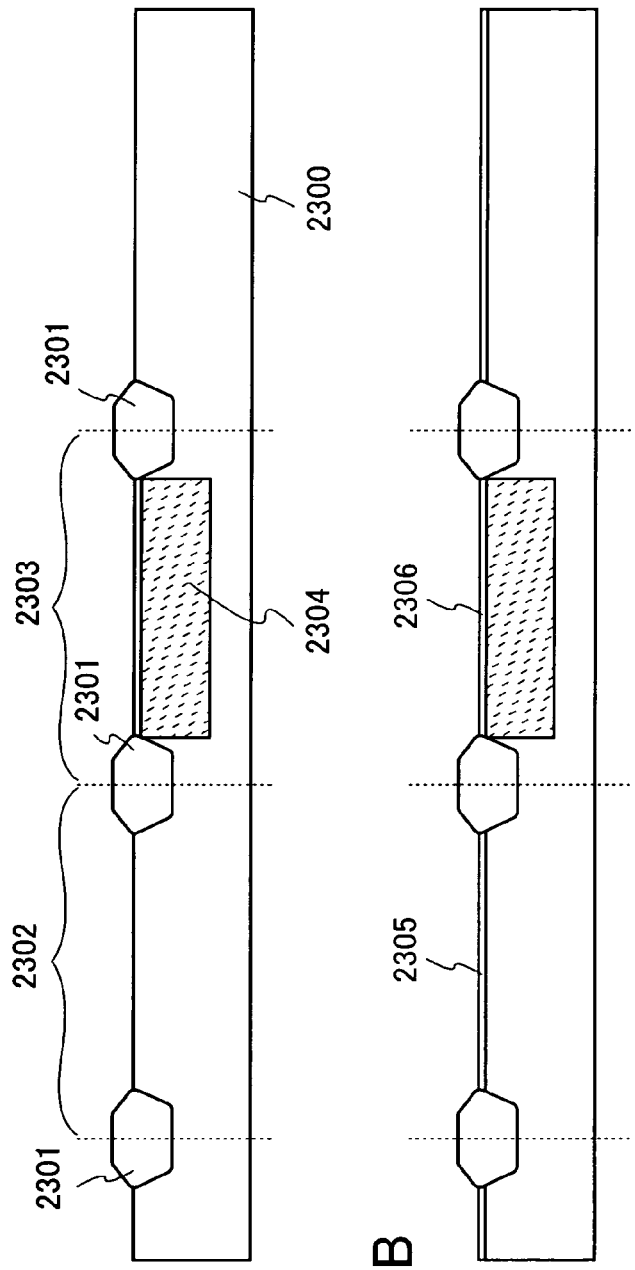
FIGS. 12A to 12C are diagrams showing an example of a manufacturing method of a semiconductor device of the present invention.

First, as shown in FIG. 12A, element separating insulating films 2301 for electrically separating semiconductor elements are formed of insulating films in a semiconductor substrate 2300. By formation of the element separating insulating films 2301, a region in which a transistor is to be formed (an element formation region) 2302 and an element formation region 2303 can be electrically separated from each other.

As the semiconductor substrate 2300, for example, any of the following can be used: a single crystalline silicon substrate having n-type or p-type conductivity, a compound semiconductor substrate (e.g., a GaAs substrate, an InP substrate, a GaN substrate, a SiC substrate, a sapphire substrate, or a ZnSe substrate), or an SOI (silicon on insulator) substrate formed by a bonding method or a SIMOX (separation by implanted oxygen) method.

The element separating insulating films 2301 can be formed by a selective oxidation method (a LOCOS (local oxidation of silicon) method), a trench isolation method, or the like.

Described in this embodiment mode is the case where an n-type semiconductor substrate is used as the semiconductor substrate 2300 and a p well 2304 is formed in the element formation region 23003. The p well 2304 formed in the element formation region 23003 in the semiconductor substrate 2300 can be formed by selectively introducing a p-type impurity element into the element formation region 23003. As the p-type impurity element, boron (B), aluminum (Al), gallium (Ga), or the like can be used. Alternatively, in the case where a p-type semiconductor substrate is used as the semiconductor substrate 2300, an n-type impurity element may be introduced into the element formation region 2302 to form an n well.

Note that, in this embodiment mode, since the semiconductor substrate 2300 is an n-type semiconductor substrate, an impurity element is not introduced into the element formation region 2302. However, an n well may be formed in the element formation region 2302 by introducing an n-type impurity element. As the n-type impurity element, phosphorus (P), arsenic (As), or the like can be used.

Figure 12B:
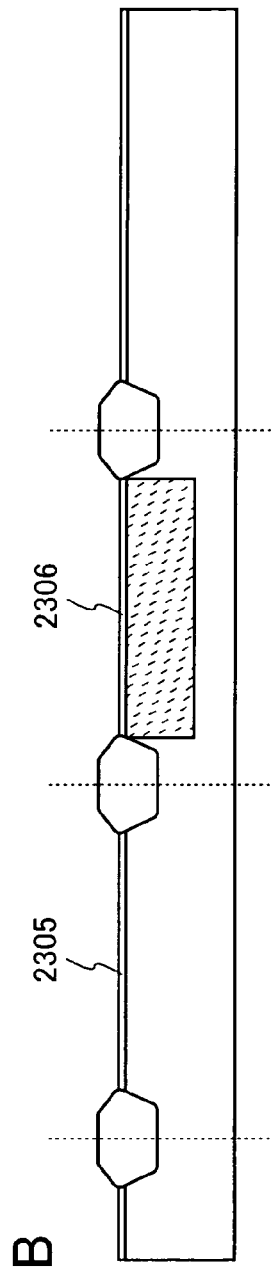

Next, as shown in FIG. 12B, insulating films 2305 and 2306 are formed to cover the element formation regions 2302 and 2303, respectively. In this embodiment mode, silicon oxide films formed in the element formation regions 2302 and 2303 by thermal oxidation of the semiconductor substrate 2300 are used as the insulating films 2305 and 2306. Alternatively, silicon oxide films may be formed by thermal oxidation and silicon oxynitride films may be formed by nitridation of surfaces of the silicon oxide films so that a stacked layer of the silicon oxide film and the silicon oxynitride film may be used as each of the insulating films 2305 and 2306.

Further alternatively, the insulating films 2305 and 2306 may be formed by plasma treatment as described above. For example, silicon oxide ($SiO_x$) films or silicon nitride ($SiN_x$)

films can be formed as the insulating films 2305 and 2306 in the element formation regions 2302 and 2303 by application of high-density plasma oxidation or high-density plasma nitridation treatment to the surface of the semiconductor substrate 2300.

Figure 12C:
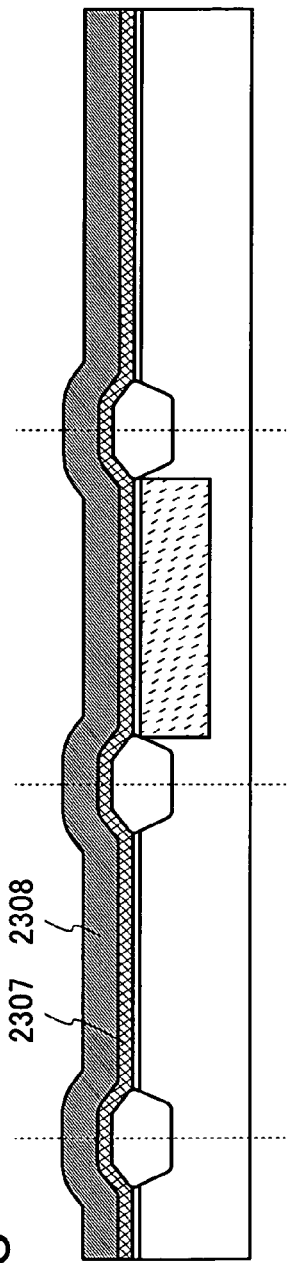

Next, as shown in FIG. 12C, a conductive film is formed to cover the insulating films 2305 and 2306. In this embodiment mode, the case where a conductive film 2307 and a conductive film 2308 which are sequentially stacked are used as the conductive film is described. The conductive film may be a single-layer conductive film or a stacked layer of three or more conductive films.

Each of the conductive films 2307 and 2308 can be formed of tantalum (Ta), tungsten (W), titanium (Ti), molybdenum (Mo), aluminum (Al), copper (Cu), chromium (Cr), niobium (Nb), or the like. Alternatively, the conductive films 2307 and 2308 may each be a film formed of an alloy containing the above metal as its main component, or a film formed of a compound containing the above metal as well as the film formed of the above metal. Further alternatively, a semiconductor such as polycrystal silicon doped with an impurity element such as phosphorus which imparts one conductivity type to a semiconductor film may be used. In this embodiment mode, the conductive film 2307 is formed of tantalum nitride and the conductive film 2308 is formed of tungsten.

Next, as shown in FIG. 13A, the stacked conductive films 2307 and 2308 are processed (e.g., patterned) into a predetermined shape to form gate electrodes 2309 and 2310 over the insulating films 2305 and 2306, respectively.

Next, as shown in FIG. 13B, a mask 2311 is selectively formed of a resist to cover the element formation region 2302. Then, an impurity element is introduced into the element formation region 2303. Since the gate electrode 2310 as well as the mask 2311 functions as a mask, impurity regions 2312 which function as a source and drain region and a channel formation region 2313 are formed in the p well 2304 by introduction of the above impurity element. As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. In this embodiment mode, phosphorus (P) is used as the impurity element.

Next, the mask 2311 is removed and then a mask 2314 is selectively formed of a resist to cover the element formation region 2303 as shown in FIG. 13C. Then, an impurity element is introduced into the element formation region 2302. Since the gate electrode 2309 as well as the mask 2314 functions as a mask, impurity regions 2315 which function as a source and drain region and a channel formation region 2316 are formed in the element formation region 2302 in the semiconductor substrate 2300 by the introduction of the impurity element. As the impurity element, an n-type impurity element or a p-type impurity element is used. As the n-type impurity element, phosphorus (P), arsenic (As), or the like can be used. As the p-type impurity element, boron (B), aluminum (Al), gallium (Ga), or the like can be used. In this embodiment mode, an impurity element (e.g., boron (B)) which has a different conductivity type from the impurity element introduced into the element formation region 2303 in FIG. 13B is introduced.

Figure 14A:
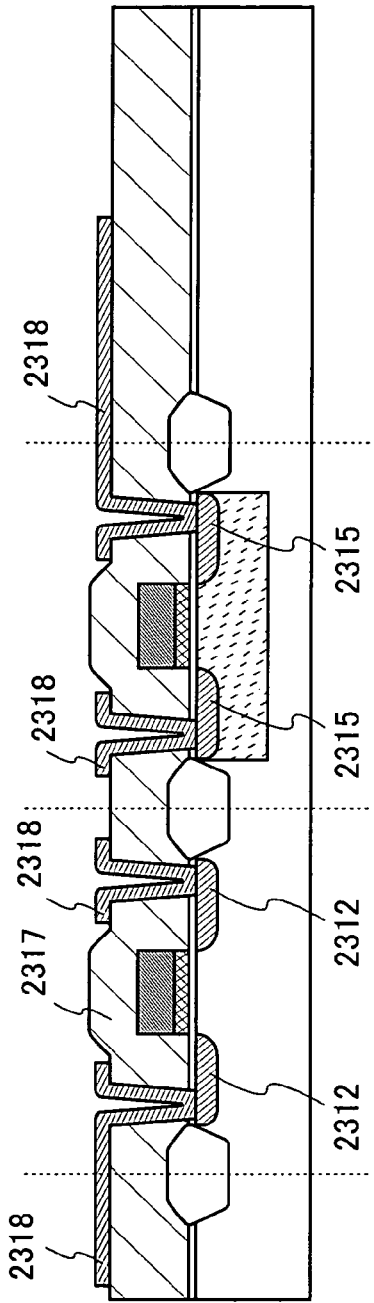
FIGS. 14A and 14B are diagrams showing an example of a manufacturing method of a semiconductor device of the present invention.

Next, as shown in FIG. 14A, an insulating film 2317 is formed to cover the insulating films 2305 and 2306 and the gate electrodes 2309 and 2310. Then, contact holes are formed in the insulating film 2317 to expose part of the impurity regions 2312 and 2315. Next, conductive films 2318 are formed to be connected to the impurity regions 2312 and 2315 through the contact holes. The conductive films 2318 can be formed by a CVD method, a sputtering method, or the like.

The insulating film 2317 can be formed of an inorganic material, an organic material, or a mixture of an inorganic material and an organic material. For example, silicon oxide, silicon oxynitride, silicon nitride oxide, or a carbon-containing film typified by a diamond-like carbon (DLC) film, acrylic, epoxy, polyimide, polyamide, polyvinylphenol, benzocyclobutene, or the like can be used. Further, the insulating film 2317 can be formed by a CVD method, a sputtering method, a droplet discharge method, a printing method, or the like in accordance with its material.

Note that a structure of a transistor used in the semiconductor device of the present invention is not limited to the structure shown in this embodiment mode. For example, an inverted staggered structure may be employed as well.

Figure 14B:
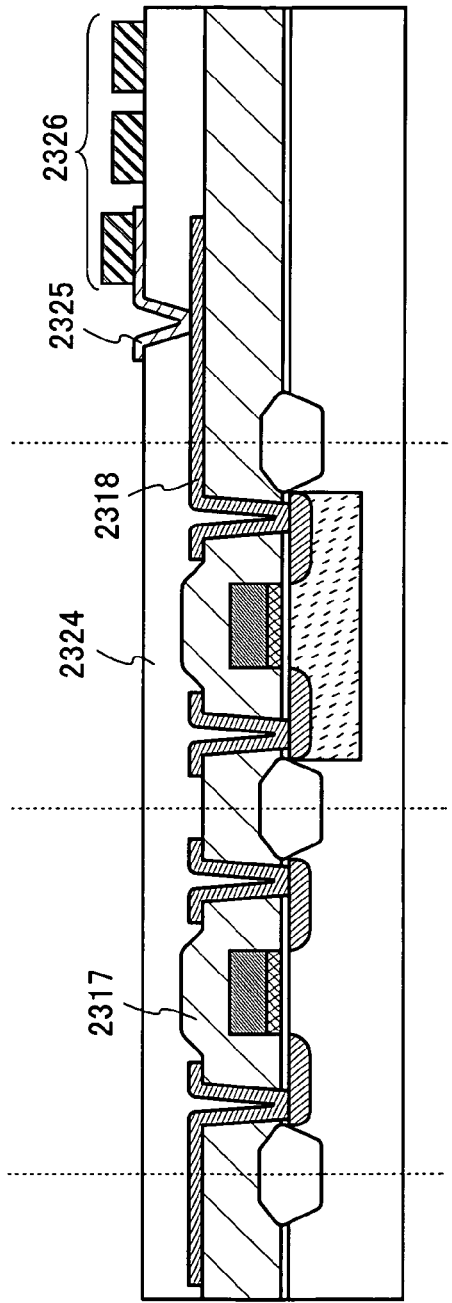

Next, as shown in FIG. 14B, an interlayer film 2324 is formed. Then, the interlayer film 2324 is etched to form a contact hole, so that part of the conductive film 2318 is exposed. The interlayer film 2324 is not limited to a resin film, but may be any other film such as an oxide film formed by CVD; however, a resin film is preferable in terms of planarity. Alternatively, a photosensitive resin may be used, so that a contact hole may be formed without etching. Next, a wiring 2325 is formed over the interlayer film 2324 so as to be in contact with the conductive film 2318 through the contact hole.

Next, a conductive film 2326 which functions as an antenna is formed to be in contact with the wiring 2325. The conductive film 2326 can be formed of a metal such as silver (Ag), gold (Au), copper (Cu), palladium (Pd), chromium (Cr), platinum (Pt), titanium (Ti), tantalum (Ta), tungsten (W), aluminum (Al), iron (Fe), cobalt (Co), zinc (Zn), tin (Sn), or nickel (Ni). The conductive film 2326 may be formed of a film which is formed of an alloy containing the above metal as its main component or a film which is formed of a compound containing the above element as well as the film formed of the above metal. The conductive film 2326 may be a single layer of the above film or a stack of a plurality of the films.

The conductive film 2326 can be formed by a CVD method, a sputtering method, a printing method such as screen printing or gravure printing, a droplet discharge method, a dispenser method, a plating method, a photolithography method, an evaporation method, or the like.

Although the case where an antenna and a semiconductor element are formed over the same substrate is described in this embodiment mode, the present invention is not limited to this structure. A semiconductor element may be formed, and then a separately-formed antenna may be electrically connected to an integrated circuit, as well. In this case, the electrical connection between the antenna and the integrated circuit can be performed by pressure bonding with an anisotropic conductive film (ACF), an anisotropic conductive paste (ACP), or the like. Alternatively, the connection can be performed using a conductive adhesive such as a silver paste, a copper paste, or a carbon paste; solder joint; or the like.

As described above, according to the manufacturing method of this embodiment mode, variation of properties of transistors can be suppressed, so that the number of transistors used in a semiconductor device can be reduced and a semiconductor device capable of stable operation can be provided.

Note that this embodiment mode can be combined with any structure of a semiconductor device described in another embodiment mode in this specification, as appropriate.

Embodiment Mode 7

In this embodiment mode, a method for manufacturing a semiconductor device, unlike the above embodiment mode is described using drawings. Specifically, the case where a single crystal semiconductor (e.g., single-crystal silicon) which is provided by attachment to a glass substrate, a plastic substrate, or the like is used as a semiconductor film over an insulating substrate used for manufacturing a transistor or the like is described.

First, a method for manufacturing an insulating substrate provided with a single crystal semiconductor (hereinafter, referred to as an SOI (silicon on insulator) substrate) is described.

Figure 15A:
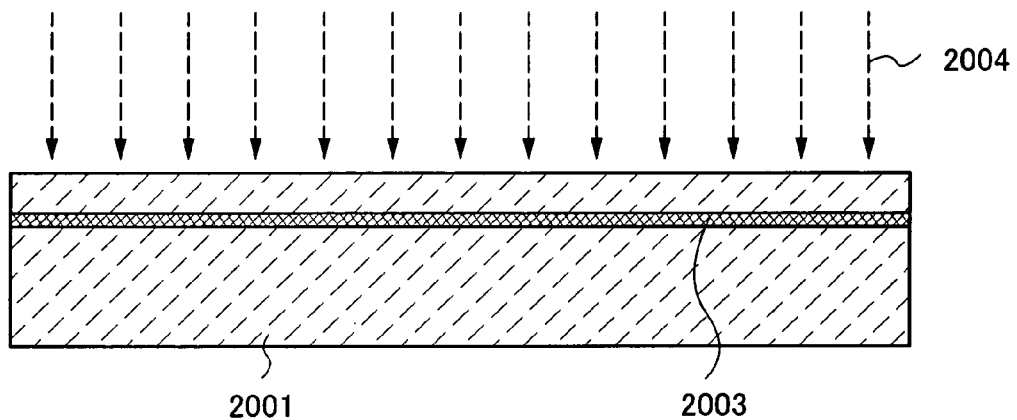
FIGS. 15A to 15C are diagrams showing an example of a manufacturing method of a semiconductor device of the present invention.
Figure 17A:
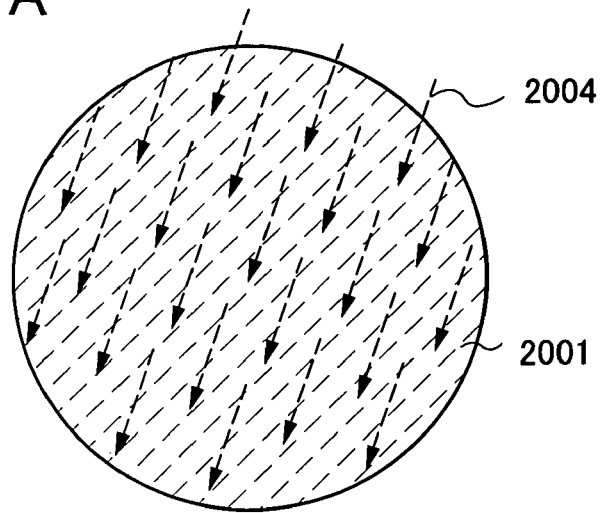
FIGS. 17A to 17C are diagrams showing an example of a manufacturing method of a semiconductor device of the present invention.

A semiconductor substrate 2001 is prepared (see FIGS. 15A and 17A). As the semiconductor substrate 2001, a commercial semiconductor substrate may be used; for example, a silicon substrate, a germanium substrate, and a compound semiconductor substrate formed of gallium arsenide or indium phosphide can be given. As for the commercial silicon substrate, the typical size is the following; 5 inches (125 mm) in diameter, 6 inches (150 mm) in diameter, 8 inches (200 mm) in diameter, or 12 inches (300 mm) in diameter, and the typical shape is circular. Further, the film thickness can be selected to about 1.5 mm, as appropriate.

Next, ions 2004 that are accelerated by application of an electric field are added at a predetermined depth from the surface of the semiconductor substrate 2001 to form an ion-doped layer 2003 (see FIGS. 15A and 17A). The doping of ions 2004 is performed in consideration of the thickness of an SOI layer which is to be transferred to a base substrate. The thickness of the SOI layer is set to be 5 to 500 nm, preferably, 10 to 200 nm. An accelerating voltage for introducing ions into the semiconductor substrate 2001 and the ion dosage are set in consideration of the thickness of the SOI layer which is to be transferred. As the ions 2004, ions of hydrogen, helium, or halogen typified by fluorine can be used. Note that it is preferable to introduce an ion source formed of either a single atom or a plurality of atoms which is generated by plasma excitation of a source gas selected from hydrogen, helium, and a halogen element, as each ion 2004. In the case of doping with hydrogen ions, it is preferable that the hydrogen ions include $H^+$, $H_2^+$, and $H_3^+$ ions with a high proportion of $H_3^+$ ions because the addition efficiency can be increased and doping time can be shortened. By thus performing ion doping where the proportion of $H_3^+$ ions is higher than that of $H^+$ ions or $H_2^+$ ions so that the semiconductor substrate 2001 contains a large number of hydrogen ions, separation can be easily performed with a lower dose than in the case of performing ion doping where the proportion of $H_3^+$ ions is not higher than that of other hydrogen ions. Note that the "ion doping" in this specification refers to a method by which an ionized gas that is generated from a source gas and accelerated by an application of an electric field without mass separation is added to an object to be processed. Further, the "ion-doped layer" refers to a region into which ions are introduced by ion doping; for example, it refers to a region to which ions of hydrogen, helium, or halogen typified by fluorine are added.

Note that, in order to form the ion-doped layer 2003 at a predetermined depth, there is a case where the ions 2004 need to be introduced at a high dose. In this case, the surface of the semiconductor substrate 2001 may be roughened depending on the condition. Therefore, a protective layer for the semiconductor substrate 2001, such as a silicon oxide layer, a silicon nitride layer, or a silicon nitride oxide layer with a thickness of 0.5 to 200 nm may be provided on a surface of the semiconductor substrate 2001, into which the ions are introduced.

Figure 15B:
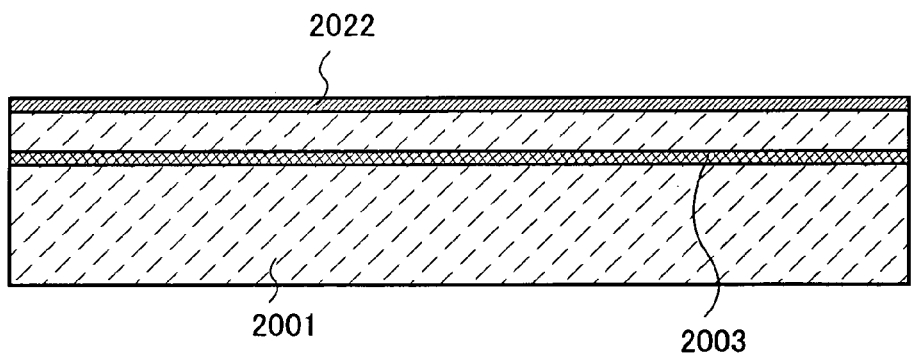
Figure 17B:
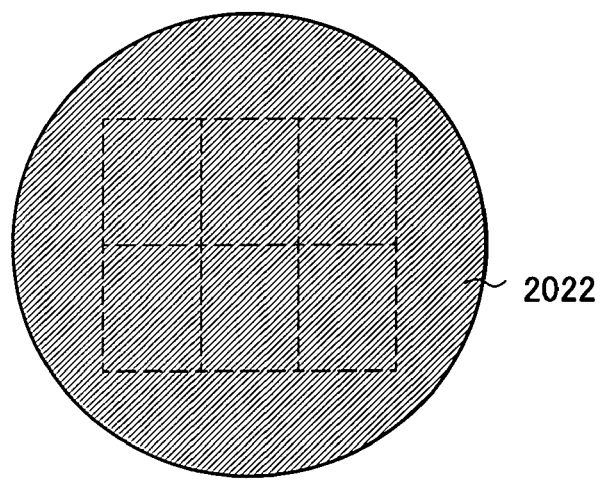

Next, a bonding layer 2022 is provided for the semiconductor substrate 2001 (see FIGS. 15B and 17B). The bonding layer 2022 is formed over a surface of the semiconductor substrate 2001 which is to form a bond with a base substrate. A silicon oxide film formed by a chemical vapor deposition method using organic silane as a source gas is preferably used as the bonding layer 2022, here. Further, a silicon oxide film formed by a chemical vapor deposition method using silane as a source gas can be used, as well. The film formation by a chemical vapor deposition method is performed at a temperature, for example, 350° C. or lower, at which degassing of the ion-doped layer 2003 that is formed in the semiconductor substrate 2001 does not occur (a temperature at which the surface of the silicon oxide film that is formed as the bonding layer 2022 is not roughened or at which a crack does not occur in the ion-doped layer 2003). Note that, in the case where a single crystalline or polycrystalline semiconductor substrate is used as the semiconductor substrate 2001, heat treatment for separating an SOI layer from the substrate is performed at a higher temperature than the temperature for forming the bonding layer 2022.

Figure 15C:
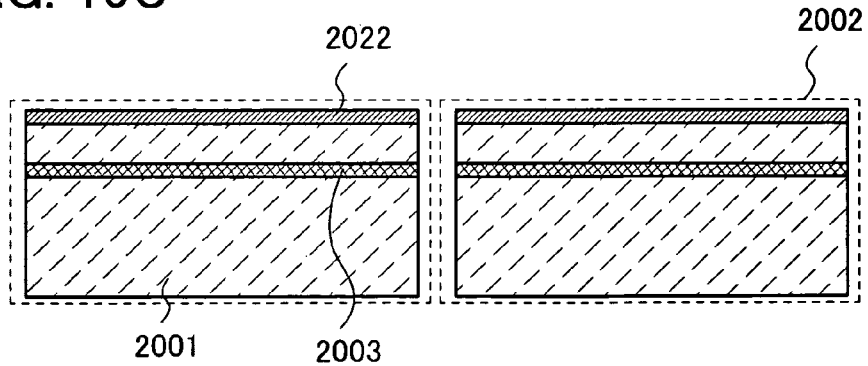
Figure 17C:
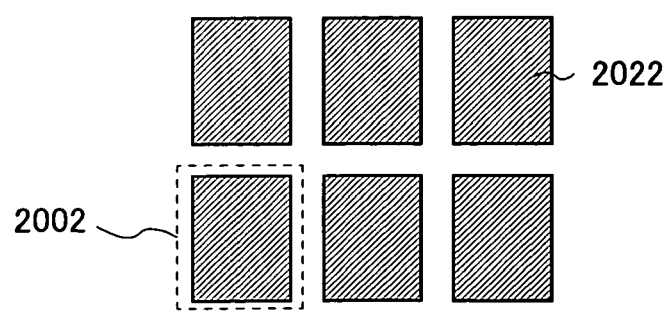

Next, the semiconductor substrate 2001 is processed into a predetermined largeness and shape (see FIGS. 15C and 17C). Specifically, the semiconductor substrate 2001 is processed to have a desired size. In FIG. 17C, the case where the circular semiconductor substrate 2001 is divided to form a rectangular semiconductor substrate 2002 is shown. At this time, the bonding layer 2022 and the ion-doped layer 2003 are also divided. That is, the semiconductor substrate 2002 with a desired size, in which the ion-doped layer 2003 is formed at a predetermined depth and the bonding layer 2022 is formed over the surface (surface to bond with the base substrate) can be obtained.

It is preferable that the semiconductor substrate 2002 be divided in advance to have a desired size. Division of the semiconductor substrate 2002 can be performed with an appropriate cutting means, for example, a cutting apparatus such as a dicing machine or a wire saw, laser cutting, plasma cutting, or electron beam cutting.

Note that the sequence of steps until the bonding layer is formed over the surface of the semiconductor substrate can be changed as appropriate. In FIGS. 15A to 15C and 17A to 17C, the example in which the ion-doped layer is formed in the semiconductor substrate, the bonding layer is formed over the surface of the semiconductor substrate, and then, the semiconductor substrate is processed into a desired size is shown. Alternatively, for example, the following sequence can also be used; the semiconductor substrate is processed into a desired size, the ion-doped layer is formed in the semiconductor substrate with the desired size, and then, the bonding layer is formed over the surface of the semiconductor with the desired size.

Figure 16A:
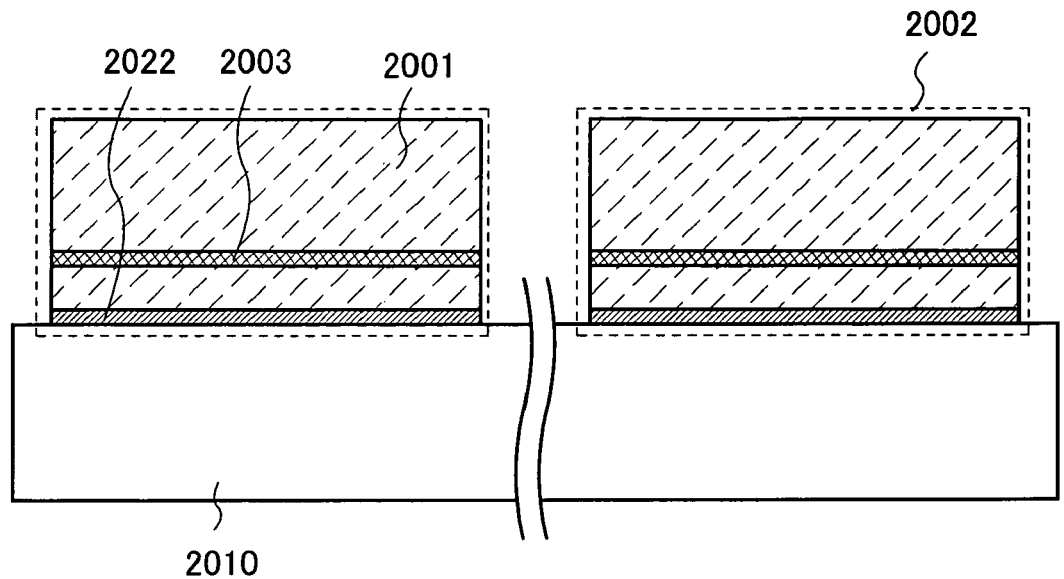
FIGS. 16A and 16B are diagrams showing an example of a manufacturing method of a semiconductor device of the present invention.

Next, a base substrate 2010 and the semiconductor substrate 2002 are attached to each other. FIG. 16A shows an example in which the base substrate 2010 is placed close to the surface of the semiconductor substrate 2002, where the bonding layer 2022 is formed, to bond the two to each other. Note that it is preferable that the surfaces which are to form the bond (surfaces to be bonded to each other) be cleaned sufficiently. By attaching the base substrate 2010 in close contact with the bonding layer 2022, the bond is formed therebetween by van der Waals forces. By applying pressure thereon using to attach the base substrate 2010 and the semiconductor substrate 2002 to each other, a stronger bond than by van der Waals forces can be formed by hydrogen bonding.

In order to form a favorable bond between the base substrate 2010 and the bonding layer 2022, the surfaces which are to bond to each other may be activated. For example, either one or both of the surfaces which are to bond to each other is irradiated with an atomic beam or an ion beam. When an atomic beam or an ion beam is used, an inert gas neutral atom beam or inert gas ion beam of argon or the like can be used. Alternatively, plasma irradiation or radical treatment can also be performed for activation of the surfaces which are to bond to each other. Such a surface treatment makes it more easy to increase bonding strength between different kinds of materials even if a later heat treatment step is performed at a temperature of 400° C. or less.

After the base substrate 2010 and the semiconductor substrate 2002 are attached to each other with the bonding layer 2022 interposed therebetween, it is preferable that heat treatment or pressurization treatment or both heat treatment and pressurization treatment be performed. Heat treatment or pressurization treatment makes it possible to increase bonding strength. The temperature of the heat treatment is preferably equal to or lower than the upper temperature limit of the base substrate 2010 and a temperature at which the element added in the previous doping step is detached. The pressurization treatment is performed so that pressure is applied perpendicular to the bonding surface, in consideration of the pressure resistance of the base substrate 2010 and the semiconductor substrate 2002.

Figure 16B:
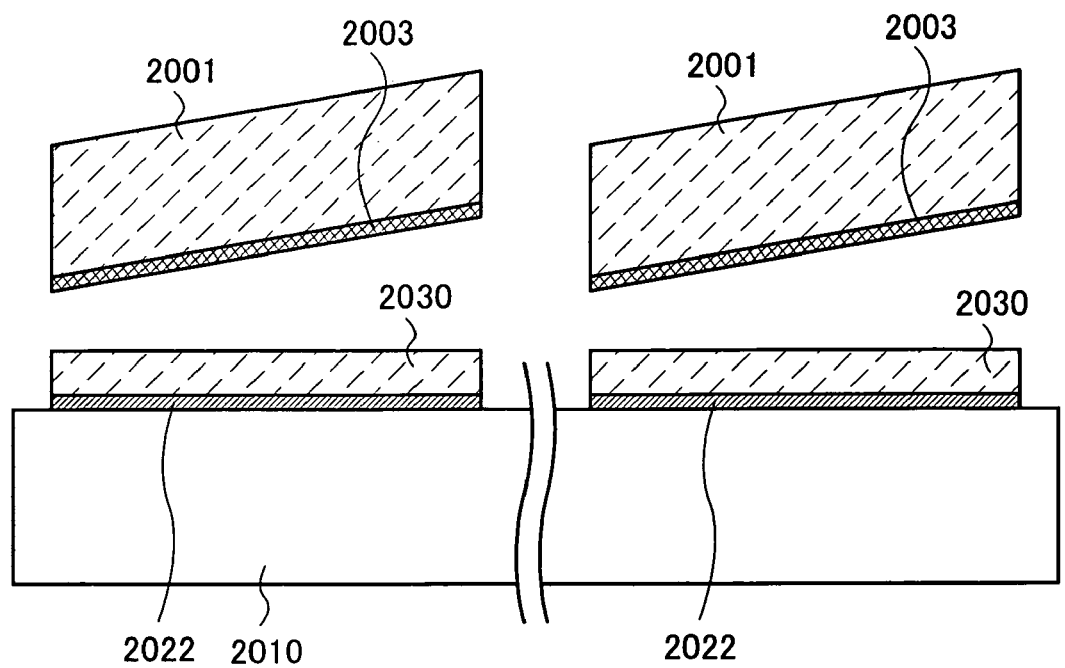

Next, heat treatment is performed to separate part of the semiconductor substrate 2002 from the base substrate 2010 with the ion-doped layer 2003 used as a cleavage plane (see FIG. 16B). The heat treatment is preferably performed at a temperature ranging from the temperature at which the bonding layer 2022 is formed to the upper temperature limit of the base substrate 2010. When the heat treatment is performed at, for example, 400° C. to 600° C., a change in volume of fine voids formed in the ion-doped layer 2003 occurs, which enables cleavage to occur along the ion-doped layer 2003. Because the bonding layer 2022 is bonded to the base substrate 2010, an SOI layer 2030 having the same crystallinity as the semiconductor substrate 2002 is left over the base substrate 2010.

Through the above, an SOI structure in which the SOI layer 2030 is provided over the base substrate 2010 with the bonding layer 2022 interposed therebetween is formed. Note that an SOI substrate is a structure in which a plurality of SOI layers is provided over one base substrate with a bonding layer interposed therebetween.

Note that it is preferable that the surface of the SOI layer obtained by the separation be polished to be planarized by chemical mechanical polishing (CMP). Further, instead of using a physical polishing means such as CMP, the surface of the SOI layer may be planarized by laser irradiation as well. Note that the laser irradiation is preferably performed under a nitrogen atmosphere having an oxygen concentration of 10 ppm or less. This is because laser irradiation under an oxygen atmosphere may make the surface of the SOI layer rough. Further, CMP or the like may be performed in order to thin the obtained SOI layer.

According to the manufacturing method of an SOI substrate described in this embodiment mode, the SOI layer 2030 that is strongly bonded to the substrate can be obtained even when a substrate with an upper temperature limit of 600° C. or less, such as a glass substrate, is used as the base substrate 2010. Further, since a process at a temperature of 600° C. or less can be applied, any glass substrate used in the electronics industry, called a non-alkali glass substrate, such as an aluminosilicate glass substrate, an aluminoborosilicate glass substrate, and a barium borosilicate glass substrate can be used as the base substrate 2010. Of course, a ceramic substrate, a sapphire substrate, a quartz substrate, or the like can be used as well.

Note that, by implementation of the process shown in FIGS. 9A to 9D, 10A to 10C, and 11A and 11B with the SOI substrate obtained by the method shown in FIGS. 15A to 15C, 16A and 16B, and 17A to 17C, a semiconductor device including a transistor using a single crystalline semiconductor film and the like can be obtained. Note that the single crystalline semiconductor film can be formed directly on an insulating substrate such as a glass substrate by the use of the SOI substrate described in this embodiment mode, so that a crystallization process of a semiconductor film for forming a transistor is necessary. Specifically, by forming a transistor included in the semiconductor device described in the above embodiment mode with the use of a single crystalline semiconductor film, a semiconductor device capable of high speed operation can be manufactured. Furthermore, by formation with the use of the single crystalline semiconductor film, a highly reliable semiconductor device with less variation in transistor properties can be manufactured.

Note that this embodiment mode can be combined with any structure of a semiconductor device described in another embodiment mode in this specification, as appropriate.

Embodiment Mode 8

In this embodiment mode, usage examples of the semiconductor device described in any of the above embodiment modes are described.

Usage examples of the semiconductor device including a clock generation circuit of any of the above embodiment modes are described using FIGS. 8A to 8F. The semiconductor device is widely used and can be used by being provided for, for example, bills, coins, securities, bearer bonds, documents (e.g., driver's licenses or resident's cards, see FIG. 8A), packaging containers (e.g., wrapping paper or bottles, see FIG. 8C), storage media (e.g., DVD software or video tapes, see FIG. 8B), vehicles (e.g., bicycles, see FIG. 8D), personal belongings (e.g., bags or glasses), foods, plants, animals, human bodies, clothing, everyday articles, products such as electronic appliances (e.g., liquid crystal display devices, EL display devices, television sets, or mobile phones), or tags on products (see FIGS. 8E and 8F), or the like.

A semiconductor device 3000 is fixed to a product by, for example, being mounted on a printed wiring board, attached to a surface thereof, or embedded therein. For example, the semiconductor device 3000 is embedded in paper of a book, or embedded in an organic resin of a package. Since the semiconductor device 3000 can be reduced in size, thickness, and weight, it can be fixed to a product without spoiling the design of the product. Further, bills, coins, securities, bearer bonds, documents, or the like can have an identification function by being provided with the semiconductor device 3000, and the identification functions can be utilized to prevent counterfeiting. Further, the efficiency of a system such as an inspection system can be improved by providing the semiconductor device for, packaging containers, storage media, personal belongings, foods, clothing, everyday articles, electronic appliances, or the like. Even vehicles can have higher security against theft or the like by being provided with the semiconductor device.

As described above, by using the semiconductor device for each usage described in this embodiment mode, stable operation can be realized even in the case where the communication distance is increased, whereby reliability of an identification function or security of a product can be improved.

Note that this embodiment mode can be combined with any structure of a semiconductor device described in another embodiment mode in this specification, as appropriate.

This application is based on Japanese Patent Application Serial No. 2007117425 filed with Japan Patent Office on Apr. 26, 2007, the entire contents of which are hereby incorporated by reference.

What is claimed is:

1. A semiconductor device comprising:
a transmission and reception control circuit configured to receive a first signal from an outside and transmit a second signal to the outside;
a ring oscillator;
a ring oscillator control circuit operationally connected to the ring oscillator and the transmission and reception control circuit, and configured to detect an edge included in the first signal and control an operation of the ring oscillator;
a clock generation circuit operationally connected to the ring oscillator and the ring oscillator control circuit, and configured to generate a clock signal based on the operation of the ring oscillator; and
a logic circuit operationally connected to the transmission and reception control circuit, the ring oscillator control circuit, and the clock generation circuit, and configured to perform an operation in accordance with the clock signal,
wherein the operation of the ring oscillator is started and the clock signal is output from the clock generation circuit when the ring oscillator control circuit detects the edge included in the first signal, and
wherein the operation of the ring oscillator is stopped and an output of the clock signal from the clock generation circuit is stopped when a transmission of the second signal from the transmission and reception control circuit to the outside is terminated.

2. The semiconductor device according to claim 1,
wherein the ring oscillator control circuit comprises an edge detection circuit configured to detect the edge included in the first signal, a decision circuit configured to decide a state of the logic circuit, and an operation control circuit configured to control the operation of the ring oscillator, and
wherein the operation control circuit determines whether or not the ring oscillator operates based on operations of the edge detection circuit and the decision circuit.

3. The semiconductor device according to claim 1,
wherein the ring oscillator control circuit comprises an edge detection circuit configured to detect the edge included in the first signal, an edge counter circuit configured to count the number of edges, a receiving signal decision circuit configured to decide whether or not a reception of a data signal starts based on signals output from the edge detection circuit and the edge counter circuit, a decision circuit configured to decide a state of the logic circuit, and an operation control circuit configured to control the operation of the ring oscillator, and
wherein the operation control circuit determines whether or not the ring oscillator operates based on operations of the receiving signal decision circuit and the decision circuit.

4. The semiconductor device according to claim 1, wherein the reception of the first signal from the outside and the transmission of the second signal to the outside are performed wirelessly.

5. The semiconductor device according to claim 1, wherein the output of the clock signal is kept stopping until the edge is detected.

6. A semiconductor device comprising:
a transmission and reception control circuit configured to receive a first signal from an outside and transmit a second signal to the outside;
a ring oscillator;
a ring oscillator control circuit configured to detect an edge included in the first signal and control an operation of the ring oscillator;
a clock generation circuit configured to generate a clock signal based on the operation of the ring oscillator; and
a logic circuit configured to perform an operation in accordance with the clock signal,
wherein the operation of the ring oscillator is started and the clock signal is output from the clock generation circuit when the ring oscillator control circuit detects the edge included in the first signal, and
wherein the operation of the ring oscillator is stopped and an output of the clock signal from the clock generation circuit is stopped when a transmission of the second signal from the transmission and reception control circuit to the outside is terminated.

7. The semiconductor device according to claim 6,
wherein the ring oscillator control circuit comprises an edge detection circuit configured to detect the edge included in the first signal, a decision circuit configured to decide a state of the logic circuit, and an operation control circuit configured to control the operation of the ring oscillator, and
wherein the operation control circuit determines whether or not the ring oscillator operates based on operations of the edge detection circuit and the decision circuit.

8. The semiconductor device according to claim 6,
wherein the ring oscillator control circuit comprises an edge detection circuit configured to detect the edge included in the first signal, an edge counter circuit configured to count the number of edges, a receiving signal decision circuit configured to decide whether or not a reception of a data signal starts based on signals output from the edge detection circuit and the edge counter circuit, a decision circuit configured to decide a state of the logic circuit, and an operation control circuit configured to control the operation of the ring oscillator, and
wherein the operation control circuit determines whether or not the ring oscillator operates based on operations of the receiving signal decision circuit and the decision circuit.

9. The semiconductor device according to claim 6, wherein the reception of the first signal from the outside and the transmission of the second signal to the outside are performed wirelessly.

10. The semiconductor device according to claim 6, wherein the output of the clock signal is kept stopping until the edge is detected.

11. A semiconductor device comprising:
a transmission and reception control circuit configured to receive a first signal from an outside and transmit a second signal to the outside;
a ring oscillator;

a ring oscillator control circuit configured to detect an edge included in the first signal and control an operation of the ring oscillator; and a clock generation circuit configured to generate a clock signal based on the operation of the ring oscillator, wherein the operation of the ring oscillator is started and the clock signal is output from the clock generation circuit when the ring oscillator control circuit detects the edge included in the first signal, and wherein the operation of the ring oscillator is stopped and an output of the clock signal from the clock generation circuit is stopped when a transmission of the second signal from the transmission and reception control circuit to the outside is terminated.

12. The semiconductor device according to claim 11, further comprising a logic circuit configured to perform an operation in accordance with the clock signal, wherein the ring oscillator control circuit comprises an edge detection circuit configured to detect the edge included in the first signal, a decision circuit configured to decide a state of the logic circuit, and an operation control circuit configured to control the operation of the ring oscillator, and wherein the operation control circuit determines whether or not the ring oscillator operates based on operations of the edge detection circuit and the decision circuit.

13. The semiconductor device according to claim 11, further comprising a logic circuit configured to perform an operation in accordance with the clock signal, wherein the ring oscillator control circuit comprises an edge detection circuit configured to detect the edge included in the first signal, an edge counter circuit configured to count the number of edges, a receiving signal decision circuit configured to decide whether or not a reception of a data signal starts based on signals output from the edge detection circuit and the edge counter circuit, a decision circuit configured to decide a state of the logic circuit, and an operation control circuit configured to control the operation of the ring oscillator, and wherein the operation control circuit determines whether or not the ring oscillator operates based on operations of the receiving signal decision circuit and the decision circuit.

14. The semiconductor device according to claim 11, wherein the reception of the first signal from the outside and the transmission of the second signal to the outside are performed wirelessly.

15. The semiconductor device according to claim 11, wherein the output of the clock signal is kept stopping until the edge is detected.

16. A method for driving a semiconductor device, the semiconductor device comprising:
- a transmission and reception control circuit;
- a ring oscillator control circuit;
- a ring oscillator;
- a clock generation circuit; and
- a logic circuit, the method for driving the semiconductor device, comprising:
- receiving a first signal from an outside, converting the first signal to a digital signal, and outputting to the ring oscillator control circuit, in the transmission and reception control circuit;
- detecting an edge included in the first signal, in the ring oscillator control circuit;
- starting an operation of the ring oscillator in response to a detection of the edge;
- outputting a clock signal from the clock generation circuit in response to a start of the operation of the ring oscillator;
- starting an operation of the logic circuit in response to the clock signal output from the clock generation circuit;
- transmitting a second signal output from the logic circuit to the outside through the transmission and reception control circuit; and
- stopping the ring oscillator and stopping an output of the clock signal from the clock generation circuit in response to a termination of a transmission of the second signal.

17. The method for driving the semiconductor device according to claim 16, wherein the reception of the first signal from the outside and the transmission of the second signal to the outside are performed wirelessly.

18. The method for driving the semiconductor device according to claim 16, wherein the output of the clock signal is kept stopping until the edge is detected.

* * * * *